(12) United States Patent
Lee et al.

(10) Patent No.: US 11,790,146 B2
(45) Date of Patent: Oct. 17, 2023

(54) SEMICONDUCTOR DEVICE

(71) Applicant: SAMSUNG ELECTRONICS CO., LTD., Suwon-si (KR)

(72) Inventors: Jaeha Lee, Yongin-si (KR); Jintae Kim, Daejeon (KR); Seunghyun Yang, Bucheon-si (KR); Dongyeon Heo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 171 days.

(21) Appl. No.: 17/324,829

(22) Filed: May 19, 2021

(65) Prior Publication Data
US 2022/0092249 A1 Mar. 24, 2022

(30) Foreign Application Priority Data
Sep. 24, 2020 (KR) .................. 10-2020-0123868

(51) Int. Cl.
*G06F 30/392* (2020.01)
*G06F 30/398* (2020.01)
*G06F 30/394* (2020.01)

(52) U.S. Cl.
CPC .......... *G06F 30/392* (2020.01); *G06F 30/394* (2020.01); *G06F 30/398* (2020.01)

(58) Field of Classification Search
CPC ........ G06F 30/39; G06F 30/392; G06F 21/79; G06F 21/86; G06F 2221/2129; G06F 1/1626; G06F 12/0866; G06F 2212/2022; G06F 21/32; G06F 21/35; G06F 2119/18; G06F 3/0346; G06F 30/394; G06F 1/18; G06F 13/1689; G06F 15/00; G06F 7/57; G06F 9/226; G06F 9/265; G06F 9/30094; G06F 9/30101; G06F 9/3885; G06F 1/206; G06F 15/76; G06F 2119/06; G06F 30/35; G06F 30/3953; G06F 30/398; G06F 3/016; G06F 3/017; H01L 2027/11875; H01L 2027/11887; H01L 27/0207; H01L 21/8221; H01L 29/517; H01L 2027/11874;
(Continued)

(56) References Cited

U.S. PATENT DOCUMENTS 9,646,966 B2  5/2017 Moroz
10,002,860 B2 6/2018 Azmat
(Continued)

*Primary Examiner* — Binh C Tat
(74) *Attorney, Agent, or Firm* — Sughrue Mion, PLLC

(57) ABSTRACT

A semiconductor device including a standard cell is provided. The standard cell includes an active region; a gate structure intersecting the active region; a first conductive structure including: a first power supply line and a second power supply line; and a second conductive structure disposed on the first conductive structure, the second conductive structure including: first power distribution patterns spaced apart from each other a first boundary and electrically connected to the first power supply line, second power distribution patterns spaced apart from each other along a second boundary and electrically connected to the second power supply line, net metal lines disposed between and spaced apart from the first power distribution patterns and the second power distribution patterns, and electrically connected to a first portion of the signal lines, and pin metal lines electrically connected to a second portion of the signal lines.

13 Claims, 35 Drawing Sheets

(58) Field of Classification Search
CPC ............. H01L 23/5386; H01L 27/0886; H01L 27/0924; H01L 2029/7858; H01L 2924/00014; H01L 29/7802; H01L 27/0629; H01L 29/0661; H01L 2224/80895; H01L 2224/80896; H01L 2027/11881; H01L 23/5286; H01L 27/11807; H01L 29/0665; H01L 27/14665; H01L 29/516; H01L 29/0673; H01L 21/79; G03F 1/62; G03F 1/70
USPC .................................................. 716/118–125
See application file for complete search history.

(56) References Cited

U.S. PATENT DOCUMENTS

| | | |
|---|---|---|
| 10,312,192 B2 | 6/2019 | Chang et al. |
| 10,490,542 B2 | 11/2019 | Nelson et al. |
| 10,552,568 B2 | 2/2020 | Chen et al. |
| 2018/0145063 A1 | 5/2018 | Nelson et al. |
| 2019/0197214 A1* | 6/2019 | Chae ...................... G06F 30/392 |
| 2019/0393205 A1* | 12/2019 | Lee ......................... H01L 23/50 |
| 2020/0019670 A1 | 1/2020 | Chang et al. |
| 2020/0134119 A1 | 4/2020 | Sio et al. |
| 2021/0224458 A1* | 7/2021 | Guo .......................... G03F 1/70 |

* cited by examiner

US 11,790,146 B2

SEMICONDUCTOR DEVICE

CROSS-REFERENCE TO RELATED APPLICATION(S)

This application claims priority to Korean Patent Application No. 10-2020-0123868 filed on Sep. 24, 2020 in the Korean Intellectual Property Office, the disclosure of which is incorporated herein by reference in its entirety.

BACKGROUND

The present disclosure relates to a semiconductor device.

As demand for high performance, high speed, and multi-functionality in semiconductor devices has increased, an increase in the degree of integration of semiconductor devices is required. In this regard, extensive research has been conducted with respect to effective routing of wirings for connecting semiconductor elements to each other.

SUMMARY

One or more example embodiments provide a semiconductor device having an improved degree of integration and improved reliability.

According to an aspect of an example embodiment, a semiconductor device includes a standard cell including: an active region extending in a first direction on a substrate; a gate structure intersecting the active region and extending in a second direction that crosses the first direction; a first conductive structure including: a first power supply line and a second power supply line disposed on the active region and the gate structure and extending in the first direction; and signal lines disposed between the first power supply line and the second power supply line; and a second conductive structure disposed on the first conductive structure, the second conductive structure including: first power distribution patterns spaced apart from each other in the first direction along a first boundary of the standard cell and electrically connected to the first power supply line, second power distribution patterns spaced apart from each other in the first direction along a second boundary of the standard cell and electrically connected to the second power supply line, net metal lines disposed between and spaced apart from the first power distribution patterns and the second power distribution patterns, and electrically connected to a first portion of the signal lines, and pin metal lines electrically connected to a second portion of the signal lines, and extending in the second direction. The first boundary corresponds to the first power supply line and the second boundary corresponds to the second power supply line, each of the net metal lines has a center disposed on a central axis extending in the first direction between the first boundary and the second boundary, and at least one of the pin metal lines is disposed closer to the first boundary or the second boundary than the net metal lines.

According to an aspect of an example embodiment, a semiconductor device includes a standard cell including: an active region extending on a substrate in a first direction, a gate structure intersecting the active region, a power supply line structure electrically connected to the active region and extending in the first direction, first metal lines electrically connected to the gate structure, power distribution patterns disposed on the power supply line structure and spaced apart from each other in a second direction intersecting the first direction, net metal lines spaced apart from the power distribution patterns in the second direction, and pin metal lines spaced apart from the net metal lines in the first direction. The power distribution patterns, the net metal lines, and the pin metal lines are disposed on a common level, based on a surface of the substrate, the net metal lines and the power distribution patterns are disposed in accordance a distance design rule with respect to a critical spacing distance between adjacent interconnections, and the pin metal lines provide an interconnection between the standard cell and another standard cell, adjacent to the standard cell.

According to an aspect of an example embodiment, a semiconductor device includes a first standard cell and a second standard cell disposed on a substrate, each including a semiconductor element and an interconnection structure electrically connected to the semiconductor element, and the first standard cell sharing a boundary with the second standard cell. The interconnection structure includes: a first power supply line and a second power supply line configured to provide power to the semiconductor element; first metal lines configured to provide a signal to the semiconductor element; power distribution patterns electrically connected to the first power supply line and the second power supply line; net metal lines electrically connected to the first metal lines; and pin metal lines disposed at a same level as the net metal lines and disposed at a different distance from the boundary than the net metal lines. The pin metal lines are interconnection lines of a routing structure between the first standard cell and the second standard cell.

BRIEF DESCRIPTION OF DRAWINGS

The above and other aspects, features, and advantages will be more clearly understood from the following detailed description of example embodiments, taken in conjunction with the accompanying drawings, in which.

DETAILED DESCRIPTION

Hereinafter, example embodiments will be described with reference to the accompanying drawings.

Figure 1:
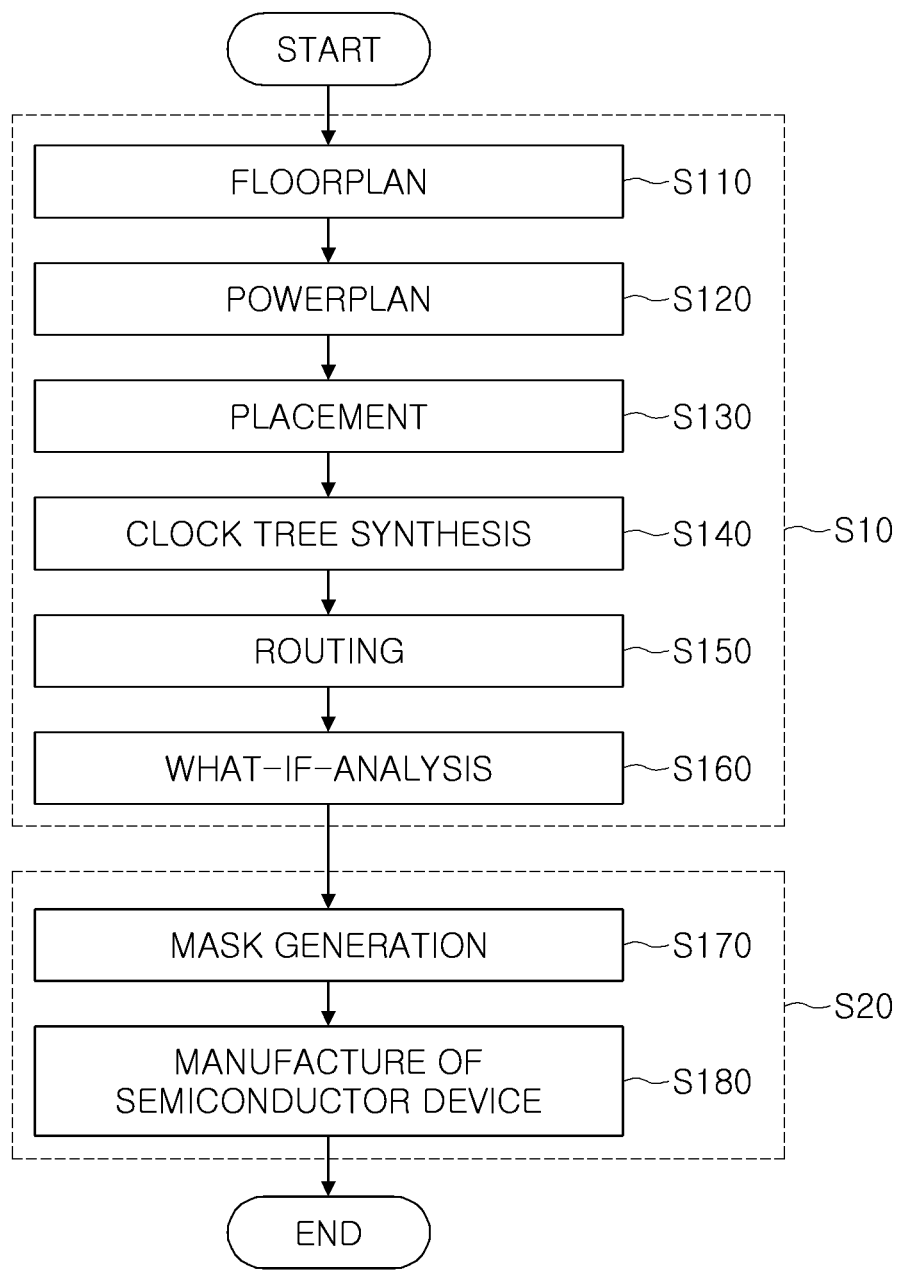
FIG. 1 is a flowchart illustrating a method of designing and fabricating a semiconductor device according to example embodiments.

FIG. 1 is a flowchart illustrating a method of designing and fabricating a semiconductor device according to example embodiments.

Referring to FIG. 1, a method of designing and fabricating a semiconductor device may include a designing operation S10 and a fabricating process operation S20. The designing operation S10 may be an operation of designing a layout for a circuit, and may be performed using a tool for designing a circuit. The tool may be a program including a plurality of instructions executed by a processor. Accordingly, the designing operation S10 may be a computer-implemented operation for designing a circuit. The fabricating process operation S20 may be an operation of fabricating a semiconductor device based on a designed layout (e.g., the circuit designed in the designing operation S10), and may be performed by a semiconductor process module.

The designing operation S10 may include a floorplan operation S110, a powerplan operation S120, a placement operation S130, a clock tree synthesis (CTS) operation S140, a routing operation S150, and a what-if-analysis operation S160.

The floorplan operation S110 may be an operation of designing cuts and movements for fabricating a logically designed schematic circuit. In the floorplan operation S110, locations corresponding to where a memory or functional blocks may be disposed are determined. In this operation, for example, functional blocks which should be placed adjacent to each other may be identified, and the functional blocks may be assigned locations in consideration of available space and required performance. For example, the floorplan operation S110 may include designing an operation of generating a site-row and designing an operation of forming a metal routing track on the generated site-row. The site-row may be a frame for placing standard cells stored in a cell library, based on a specified design rule. The metal routing track may be an imaginary line on which wirings are to be formed later.

The powerplan operation S120 may be an operation of designing placement of patterns of interconnections for connecting local power, for example, a driving voltage or a ground, in the disposed functional blocks. For example, patterns of interconnections connecting power or grounds may be formed such that the power is uniformly supplied to entire chip in the form of a net. For example, a pattern may be referred to as a power rail or a power supply line. The placement of interconnections may be in the form of a net designed according to various rules.

The placement operation S130 may be an operation of designing placement of patterns of elements constituting the functional block, and may include an operation designing placement of standard cells. In particular, in example embodiments, each of the standard cells may include semiconductor elements and first interconnection lines connected to the semiconductor elements. The first interconnection lines may include a power transmission line, connecting power or ground, and an interconnection line transmitting a control signal, an input signal, or an output signal. Empty regions may be formed between standard cells. The empty regions may be filled with filler cells. Unlike standard cells including an operable semiconductor element and a unit circuit implemented by semiconductor elements, the filler cells may be dummy regions. By the present operation, a shape or a size of a pattern for configuring transistors and interconnections to be actually formed on a semiconductor substrate may be defined. For example, layout patterns such as a PMOS, an NMOS, an N-WELL, a gate electrode, and interconnections to be disposed thereon may be appropriately designed to form an inverter circuit on an actual semiconductor substrate.

The CTS operation S140 may be an operation of designing formation of patterns of signal lines of a center clock related to a response time determining performance of a semiconductor device.

The routing operation S150 may be an operation of designing formation of an upper interconnection structure or a routing structure including second interconnection lines connecting the placed standard cells. In particular, in this operation, a power distribution network (PDN) may be designed. In the PDN, the second interconnection lines may be electrically connected to the first interconnection lines in the standard cells, and the standard cells may be electrically connected to each other or may be connected to power or ground. The second interconnection lines may be configured to be physically formed above the first interconnection lines.

The what-if-analysis operation S160 may be an operation of verifying and correcting the generated layout. Items to be verified may include design rule check (DRC) verifying whether a layout is generated to be appropriate to a design rule, electrical rule check (ERC) verifying whether the layout is appropriately generated without electrical disconnection therein, and layout vs schematic (LVS) checking whether the layout matches a gate-level net list.

The fabricating process operation S20 may include a mask manufacturing operation S170 and a fabricating operation S180 of the semiconductor device.

The mask manufacturing operation S170 may include an operation of performing optical proximity correction (OPC) on layout data, generated in the designing operation S10, to generate mask data for forming various patterns on a plurality of layers and an operation of manufacturing a mask based on the mask data. The optical proximity correction (OPC) may be performed correct a distortion which may occur in a photolithography process. The mask may be manufactured in a manner of depicting layout patterns using a chromium thin film applied to a glass or quartz substrate.

In the fabricating operation S180, various types of exposure and etching processes may be repeatedly performed. Such processes may be repeatedly performed to sequentially form shapes of patterns configured when a layout is designed on a silicon substrate. Specifically, various semiconductor processes may be performed on a semiconductor substrate such as a wafer using a plurality of masks to fabricate a semiconductor device in which an integrated circuit is implemented. The semiconductor processes may include a deposition process, an etching process, an ion implantation process, a cleaning process, and the like. In addition, the semiconductor process may include a packaging process of mounting a semiconductor device on a printed circuit board (PCB) and encapsulating the mounted semiconductor device with an encapsulant, or a test process for the semiconductor device or the package.

Figure 2:
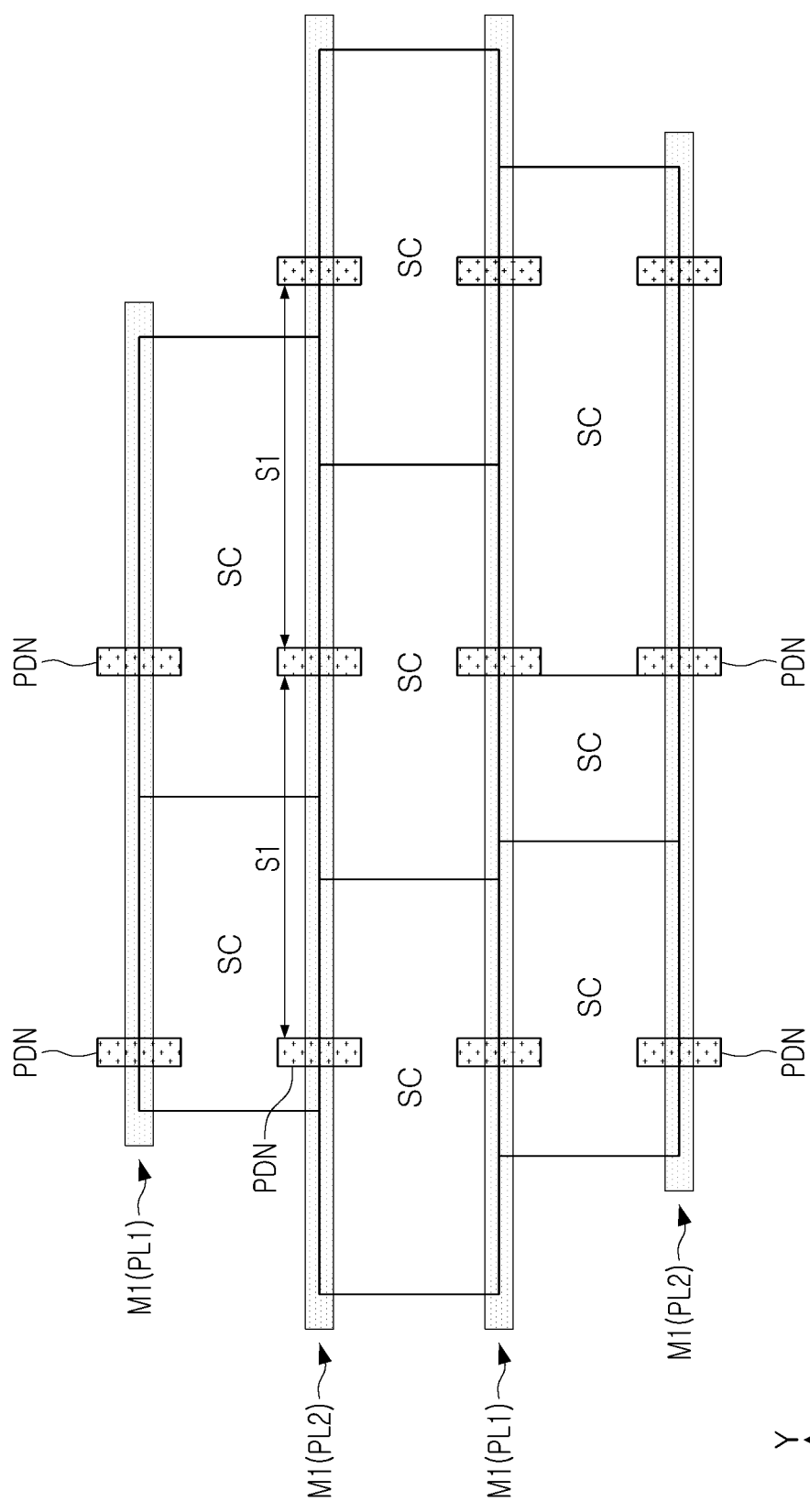
FIG. 2 is a schematic plan view of a semiconductor device according to example embodiments.

FIG. 2 is a schematic plan view of a semiconductor device according to example embodiments.

Referring to FIG. 2, a semiconductor device may include standard cells SC. The standard cells SC may be arranged in a first direction X and a second direction Y. The semiconductor device may include first and second power supply lines M1(PL1) and M1(PL2) for supplying power to standard cells SC. The semiconductor device may also include power distribution patterns PDN for distributing power to first and second power supply lines M1(PL1) and M1(PL2).

The semiconductor device may further include filler cells disposed between the standard cells to provide a dummy region.

The first and second power supply lines M1(PL1) and M2(PL2) may be power rails, and may extend in the first direction X. The first and second power supply lines M1(PL1) and M1(PL2) may extend along boundaries of the standards SC, respectively. The first and second power supply lines M1(PL1) and M1(PL2) may be arranged to be spaced apart from each other in the second direction Y. Among the first and second power supply lines M1(PL1) and M1(PL2), a power supply line disposed on a boundary between adjacent standard cells SC in the second direction Y may be a power supply line shared by the adjacent power standard cells SC.

Each of the first and second power supply lines M1(PL1) and M1(PL2) may supply different electric potentials to the standard cells SC. For example, the first power supply lines M1(PL1) may supply first power VDD to the standard cells SC, and the second power supply lines M1(PL1) may supply second power VSS to the standard cells SC. The first power VDD may be greater than the second power VSS.

The power distribution patterns PDN may be disposed on, and electrically connected to, the first and second power supply lines M1(PL1) and M1(PL2). The power distribution patterns PDN may be connected to upper-level interconnections. The upper-level interconnections may supply power to the first and second power supply lines M1(PL1) and M1(PL2) and may supply power to each of the standard cells through the power distribution patterns PDN. The power distribution patterns PDN may be line or bar-type patterns extending in the second direction Y by a predetermined distance.

A single power distribution pattern PDN or a plurality of power distribution patterns PDN may be disposed along upper and lower boundaries of each of the standard cells SC. The terms "upper boundary" and "lower boundary" used in relation to the layout of a standard cell may refer to an upper outline and a lower outline based on a center of the standard cell when viewed in a plan view, respectively. The power distribution patterns PDN may be disposed to be spaced apart from each other at a predetermined spacing S1 in the first direction X. Spacing of the power distribution patterns PDN is not limited to the predetermined spacing S1, and spacing of the power distribution patterns PDN may be relatively dense along a boundary of some standard cells SC.

The power distribution patterns PDN need to be designed to satisfy a design rule with metal lines of the standard cell SC disposed on the same level. According to the design rule, the metal lines may be disposed such that a distance between adjacent end portions of the metal lines is greater than or equal to a critical spacing distance. The critical spacing distance may refer to a minimum distance by which patterns, formed in a semiconductor device by actually patterning a layout, may be physically separated from each other.

According to example embodiments, the placement of the metal lines of the standard cells SC may be optimized to secure an effective power distribution net (PDN) solution while satisfying the design rule and to improve routing and placement of the standard cell SC.

Figure 3:
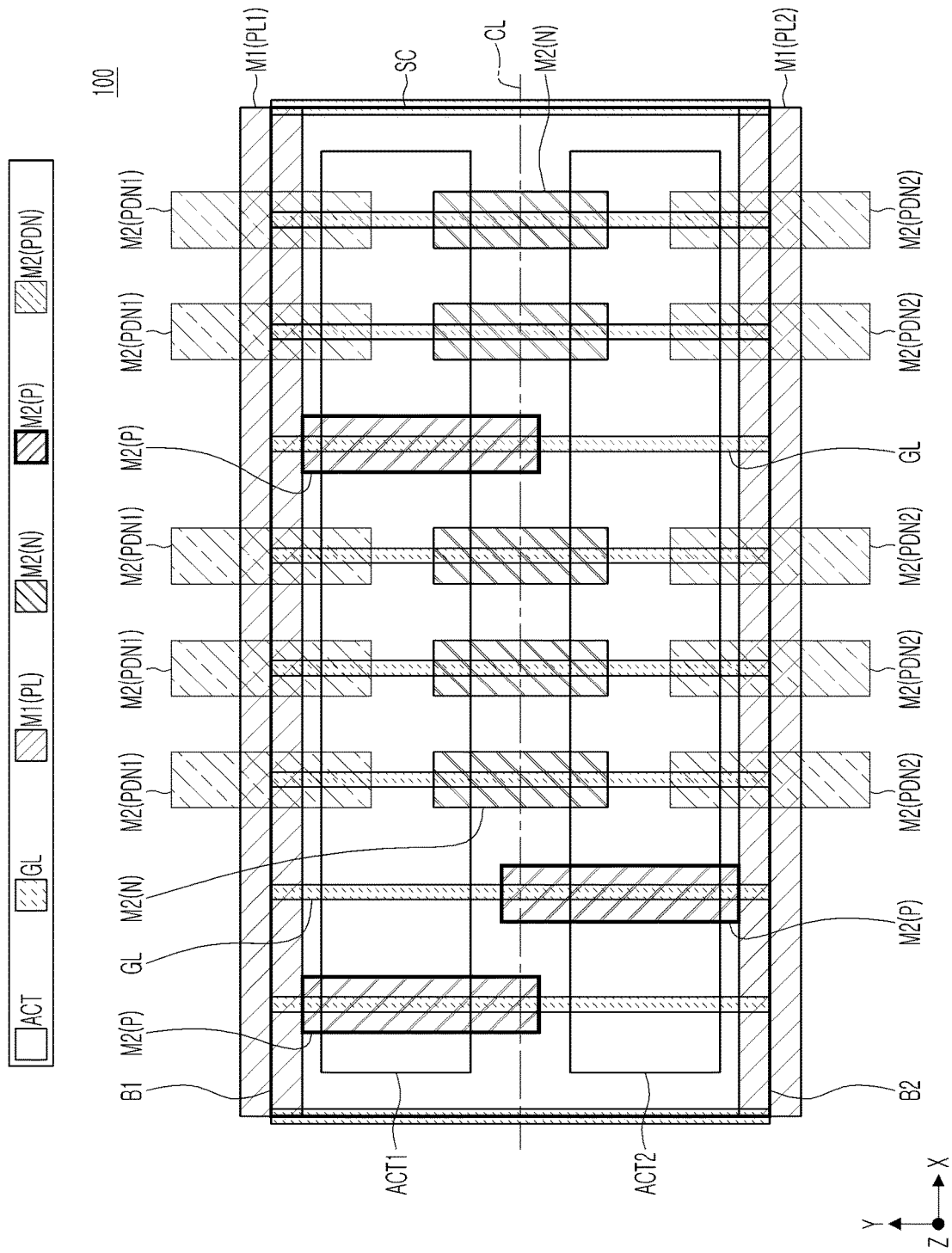
FIG. 3 is a layout diagram of a semiconductor device according to example embodiments.

FIG. 3 is a layout diagram of a semiconductor device according to example embodiments. In FIG. 3, second conductive structures M2(N), M2(P), M2(PDN), active regions ACT, gate lines GL, and power distribution patterns (PDN of FIG. 2) disposed in the standard cells of the semiconductor device of FIG. 2, are illustrated together.

Figure 4A:
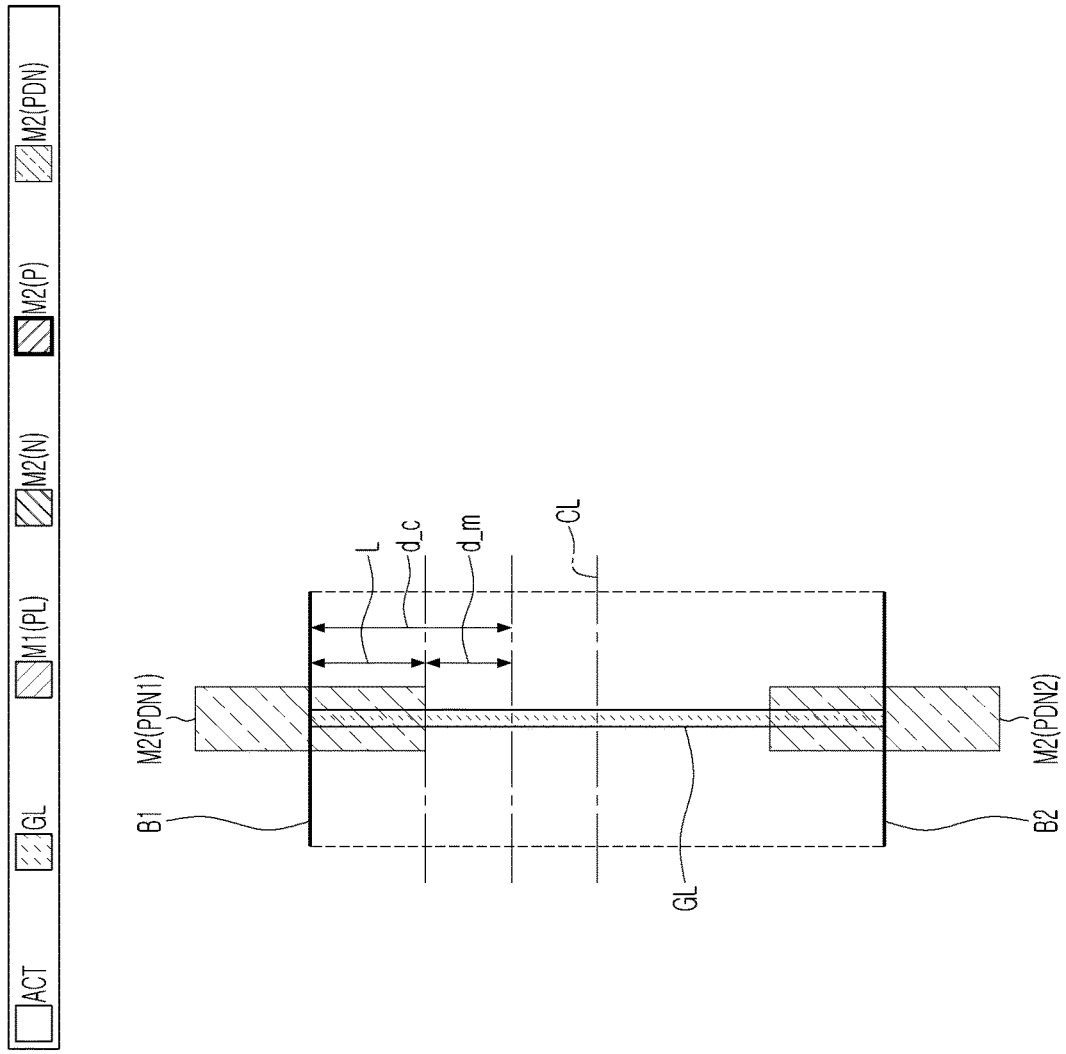
FIGS. 4A and 4B are views illustrating a layout of a semiconductor device according to example embodiments.
Figure 4B:
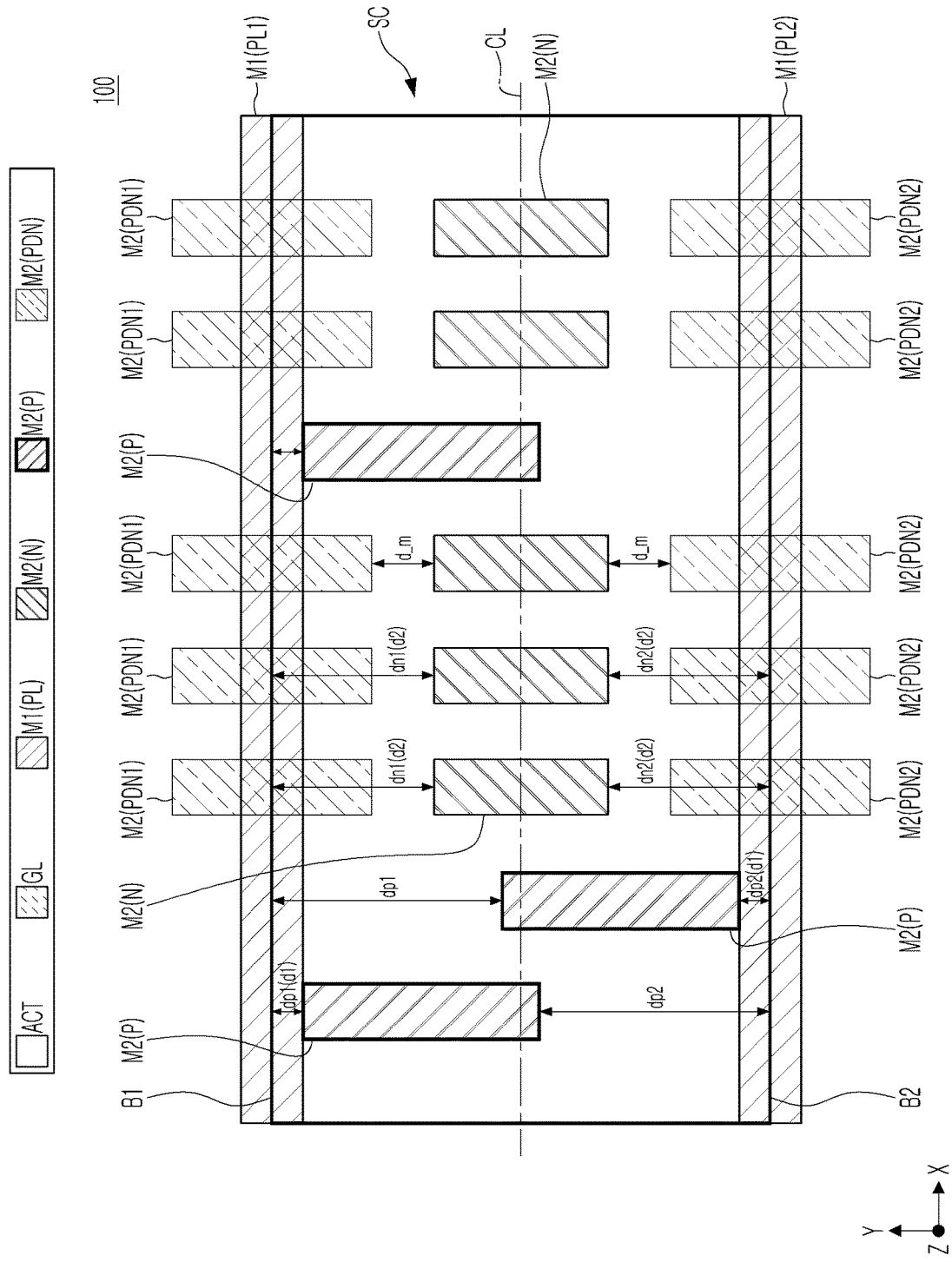

FIGS. 4A and 4B are views illustrating a layout of a semiconductor device according to example embodiments. In FIGS. 4A and 4B, some components of the semiconductor device of FIG. 3 will be omitted for ease of description. Hereinafter, a placement relationship depending on a distance or spacing between components will be understood with reference to FIGS. 4A and 4B.

Referring to FIG. 3, a standard cell SC of a semiconductor device 100 may include active regions ACT, gate lines GL, a first conductive structure M1, and a second conductive structure M2. In FIG. 3, a first active region ACT1 and a second active region ACT2 having different conductivity types, among the active regions ACT, are illustrated, first and second power supply lines M1(PL1) and M1(PL2) of the first conductive structure M1 are illustrated, and net metal lines M2(N), pin metal lines M2(P), and first power distribution patterns M2(PDN1) and M2 (PDN2) of the second conductive structure M2 are illustrated. In FIG. 3, the second conductive structure M2 is illustrated as being included in the standard cell but, according to example embodiments, some components of the second conductive structure M2 may be included in a routing structure connecting standard cells.

The first and second active regions ACT1 and ACT2 may extend in a first direction X. The first and second active regions ACT1 and ACT2 may be disposed in well regions having different conductivity types. For example, the first active region ACT1 may be disposed in an N-well region and the first active region ACT1 may have an N conductivity type, whereas the second active region ACT2 may be disposed outside of the N-well region and may have a P conductivity type. Some of the first and second active regions ACT1 and ACT2 may be electrically connected to the first and second power supply lines M1(PL1) and M1(PL2) by a contact structure disposed thereabove.

The gate lines GL extend in the second direction Y, and may be disposed to be spaced apart from each other in the first direction X. The gate lines GL may include gate electrodes and dummy gate electrodes. The gate electrodes may provide electrical connections in the semiconductor device, whereas the dummy gate electrodes are not used to provide substantial electrical functions. For example, at least some of the gate lines GL, disposed on boundaries extending in the second direction Y of the standard cell SC, may include the dummy gate electrode. The number and/or spacing of the gate lines GL, disposed in the standard cell to be described in example embodiments, is not limited to what is illustrated and may be changed in various manners.

The first and second power supply lines M1(PL1) and M1(PL2) of the first conductive structure M1 may extend in the first direction X, as described above with reference to FIG. 2. The first and second power supply lines M1(PL1) and M1(PL2) may define boundaries B1 and B2 of the standard cell SC. For example, in the standard cell SC, a first boundary B1 may be defined along a central axis of the first power supply line M1(PL1) extending in the first direction X, and a second boundary B2 may be defined along a central axis of the extending second power supply line M1(PL2) in the first direction X. The first and second boundaries B1 and B2 may indicate a pair of outlines, parallel to the extending direction of the active area ACT, among four outlines defining a single standard cell SC. The first conductive structure M1 may further include signal lines disposed on the active regions ACT1 and ACT2 and the gate lines GL in the standard cell SC, and may be changed in various manners according to example embodiments in which signal lines are disposed.

The net metal lines M2(N) of the second conductive structure M2 may be disposed between the first and second power distribution patterns M2(PDN1) and M2(PDN2). The net metal lines M2(N) may be disposed to be spaced apart from the first and second power distribution patterns M2(PDN1) and M2(PDN2) in the second direction Y. The net metal lines M2(N) may be connected to some of the signal lines of the first conductive structure M1 through lower vias. The net metal lines M2(N) may transmit a control signal, an input signal, or an output signal. The net metal lines M2(N) may connect interconnections in a single standard cell SC to each other, and may not be directly connected to interconnections of another adjacent standard cell.

A single net metal line (M2(N)) may be disposed between a single first power distribution pattern M2(PDN1) and a single second power distribution patterns M2(PDN2). The single first power distribution pattern M2(PDN1) may overlap the first boundary B1, and the single second power distribution patterns M2(PDN2) may overlap the second boundary B2. The single first power distribution pattern M2(PDN1) and the single second power distribution pattern M2(PDN2) may form a pair in the second direction Y. Because the first and second power distribution patterns M2(PDN1) and M2(PDN2) are disposed to overlap upper and lower boundaries of a standard cell SC adjacent to the net metal lines M2(N), the net metal lines M2(N) may extend in the second direction Y in only the standard cell SC.

The placement of the net metal lines M2(N) may be determined in consideration of the placement of the first and second power distribution patterns M2(PDN1) and M2(PDN2) of the second conductive structure M2.

A center of each of the net metal lines M2(N) may be disposed on a central axis CL which extends in the first direction X between the first and second boundaries B1 and B2 of the standard cell SC. The net metal lines M2(N) may be disposed to be symmetrical with respect to the central axis CL of the standard cell SC in the second direction Y. For example, each of the net metal lines M2(N) may include a first end portion, adjacent to the first boundary B1, and a second end portion adjacent to the second boundary B2. In the second direction Y, a distance dn1 between the first end portion and the first boundary B1 may be substantially the same as a distance dn2 between the second end portion and the second boundary B2.

The net metal line M2(N) may be disposed to be spaced apart from each of the first and second power distribution patterns M2(PDN1) and M2(PDN2), disposed to constitute a pair in the second direction Y, by a critical spacing distance d_m or more. The critical spacing distance may be a minimum distance between end portions of adjacent metal lines or a metal tip-to-tip space.

Even in a region having a narrow spacing between the power distribution patterns M2(PDN1) and M2(PDN2), metal lines may be efficiently disposed without violating the design rule. A space, in which power distribution patterns M2(PDN1) and M2(PDN2) are disposed, may be secured.

The pin metal lines M2(P) of the second conductive structure M2 may be disposed to be spaced apart from the net metal lines M2(N) in the first direction X. The pin metal lines M2(P) may be connected to some of the signal lines of the first conductive structure M1 by lower vias. The first and second power distribution patterns M2(PDN1) and M2(PDN2) may not be disposed on both sides of the pin metal lines M2(P) in the second direction Y for the placement of a routing structure.

The pin metal lines M2(P) may electrically connect adjacent standard cells to each other. At least one of the pin metal lines M2(P) may be disposed adjacent to at least one of the first and second boundaries B1 and B2 to be connected to metal lines of another standard cell through an upper-level interconnection, or may extend through the boundaries B1 and B2 to be connected to interconnections of another standard cell. For example, one or more of the pin metal lines M2(P) may be a routing interconnection directly connected to interconnections of another adjacent standard cell on the same level, or a routing interconnection connected to interconnections of another adjacent standard cell through upper-level interconnections, whereas the net metal lines M2(N) may be interconnections disposed in only a single standard cell.

The placement of the pin metal lines M2(P) may be determined in consideration of the placement of the first and second power distribution patterns M2(PDN1) and M2(PDN2) of the second conductive structure M2.

At least one of the pin metal lines M2(P) may be disposed to be closer to one of the first and second boundaries B1 and B2 than the net metal lines M2(N). At least one of the pin metal lines M2(P) may be disposed to be asymmetrical in the second direction Y with respect to the central axis CL of the standard cell SC. For example, at least one of the pin metal lines M2(P) may include a first end portion, adjacent to the first boundary B1, and a second end portion adjacent to the second boundary B2. In the second direction Y, a distance dp1 between the first end portion and the first boundary B1 may be different from a distance dp2 between the second end portion and the second boundary B2. For example, the distance dp1 may be smaller than dp2 in some of the pin metal lines M2(P), and dp1 may be greater than dp2 in the remainder of the pin metal lines M2(P). The distance dp1 may be smaller than the above-described distance dn1.

The first power distribution patterns M2(PDN1) of the second conductive structure M2 may be disposed to be spaced apart from each other in the first direction X on the first boundary B1, and may be electrically connected to the first power supply line M1(PL1). The second power distribution patterns M2(PDN2) of the second conductive structure M2 may be disposed to be spaced apart from each other in the first direction X on the second boundary B2, and may be electrically connected to the second power supply line M1(PL2). A portion of the first and second power distribution patterns M2(PDN1) and M2(PDN2) may be disposed to extend into the standard cell SC without violating the design rule. For example, the power distribution patterns M2(PDN1) and M2(PDN2) may be disposed to be spaced apart from the net metal lines M2(N) by a critical spacing distance or more, and end portions of the power distribution patterns M2(PDN1) and M2(PDN2) adjacent to the net metal lines M2(N) may be disposed within the standard cell SC.

The pin metal lines M2(P) and net metal lines M2(N) may be disposed according to a distance design rule based on the design rule, in relation to the power distribution patterns M2(PDN).

As illustrated in FIG. 4A, a sum of a value L, corresponding to half of a length of a single power distribution pattern in the second direction Y, and the critical spacing distance d_m may be defined as a criteria distance d_c. The value L may be the same as a distance between the first boundary B1 of the standard cell and the end portion of the first power distribution pattern M2(PDN1).

As illustrated in FIG. 4B, a minimum spacing between end portions of the pin metal lines M2(P) in the second direction and one of the first and second boundaries B1 and B2, adjacent to the end portions, may be a first spacing d1, and the pin metal lines M2(P) may be disposed according to a distance design rule satisfying $0 \le d1 < d\_c$. The first spacing d1 may refer to a smaller one of the distances dp1 and dp2. For example, the first spacing d1 may be zero, and end portions of the pin metal lines M2(P) may overlap with at least one of the first and second boundaries B1 and B2 or extend past at least one of the first and second boundaries B1 and B2.

As illustrated in FIG. 4B, a minimum spacing between end portions of the net metal lines M2(N) in the second direction Y and one of the first and second boundaries B1 and B2, adjacent to the end portions, may be a second spacing d2, and the net metal lines M2(N) may be disposed according to a distance design rule satisfying $d2 \ge d\_c$. The second spacing d2 may refer to a smaller one of the distances dn1 and dn2. The above-described distances dn1 and dn2 and the second spacing d2 may be substantially the same.

As an example, the metal lines of the first conductive structure M1 and the second conductive structure M2 may have a width ranging from about 10 nm to about 50 nm.

Figure 5:
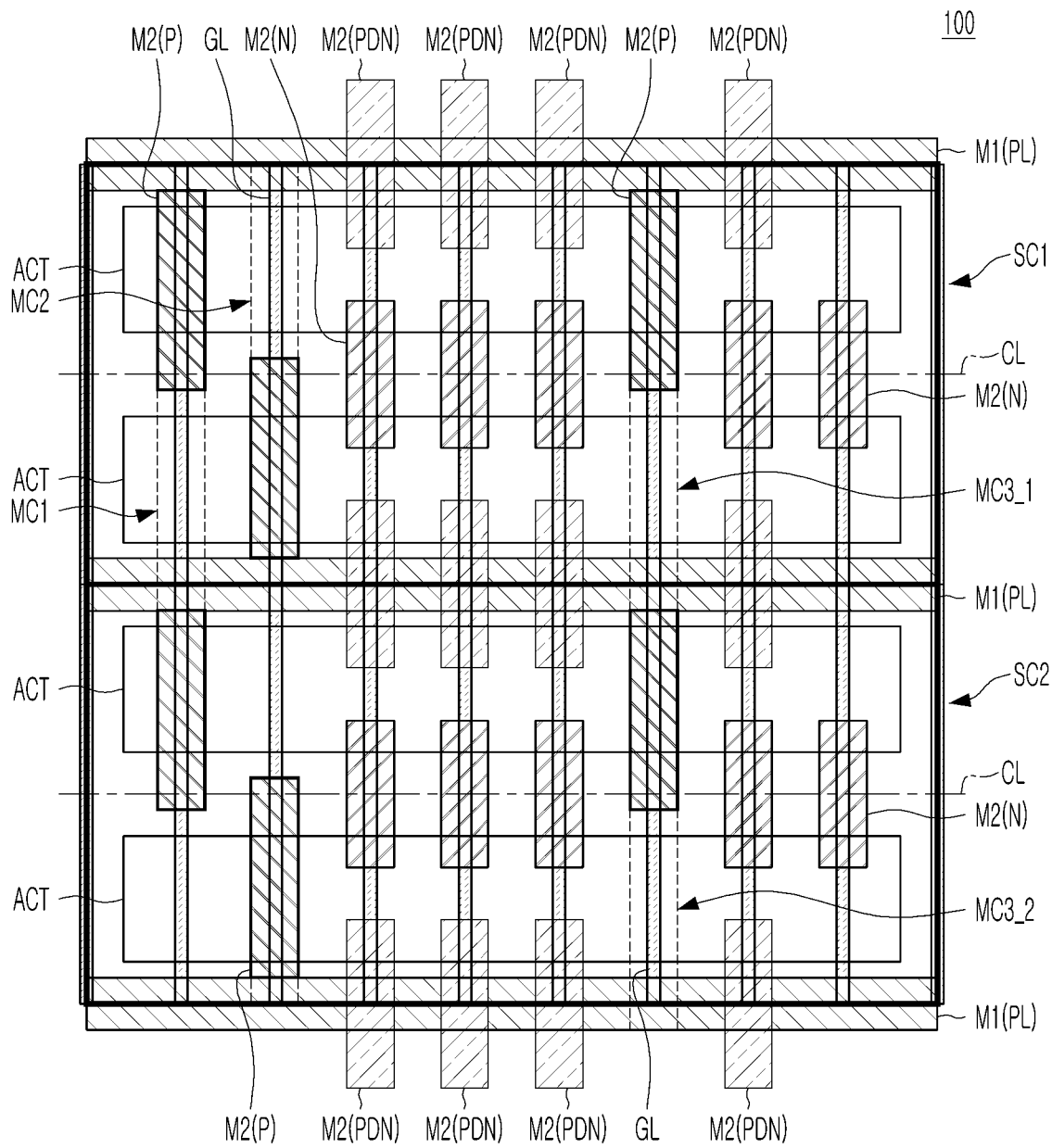
FIG. 5 is a layout diagram of a semiconductor device according to example embodiments.

FIG. 5 is a layout diagram of a semiconductor device according to example embodiments. FIG. 5 illustrates a routing relationship between two adjacent standard cells SC1 and SC2 of a semiconductor device 100.

A first standard cell SC1 and a second standard cell SC2, sharing a single power supply line M1(PL), may be disposed. The first standard cell SC1 and the second standard cell SC2 may share a single boundary. The shared single power supply line M1(PL) may extend in the first direction X along the single boundary shared by the first standard cell SC1 and the second standard cell SC2.

Each of the first standard cell SC1 and the second standard cell SC2 may include a semiconductor element and an interconnection structure electrically connected to the semiconductor element. The interconnection structure may include power supply lines M1(PL) supplying power to the semiconductor element, signal lines M1(S) applying a signal to the semiconductor element, power distribution patterns PDN electrically connected to the power supply lines M1(PL), net metal lines M2(N) electrically connected to the signal lines M1(S), and pin metal lines M2(P) disposed on the same level as the net metal lines M2(N) and disposed to closer to or farther from a boundary between standard cells SC1 and SC2 than the net metal lines M2(N). The pin metal lines M2(P) and the net metal lines M2(N) of each of the first and second standard cells SC1 and SC2 may be disposed in each of the standard cells SC1 and SC2 in the same manner as described with reference to FIGS. 3 to 4B.

As an example, the net metal lines M2(N) included in each of the first and second standard cells SC1 and SC2 may be aligned with a central axis of each of the first and second standard cells SC1 and SC2. The central axis may refer to an axis passing through a center of the first and second standard cells SC1 and SC2 in a first direction X.

The interconnection structure may be a routing structure for connection between standard cells, and may further include first to third interconnection lines MC1, MC2, MC3_1, and MC3_2.

As an example, the pin metal lines M2(P) of the first standard cell SC1 and the pin metal lines M2(P) of the second standard cell SC2 may be connected to each other by the first interconnection line MC1. For example, the first connection line MC1 may be an upper-level interconnection.

As an example, a portion of one of the pin metal lines M2(P) of the first standard cell SC1 may extend across the boundary between the standard cells SC1 and SC2 to the second standard cell SC2. A portion of one of the pin metal lines M2(P) of the second standard cell SC2 may extend across the boundary between the standard cells SC1 and SC2 to the first standard cell SC1.

As an example, some of the pin metal lines M2(P) of the first standard cell SC1 may be connected to another standard cell, adjacent to the first standard cell SC1, by the second connection line MC2. The second interconnection line MC2 may extend toward an upper boundary of the first standard cell SC1. The second interconnection line MC2 may be an upper-level interconnection connected to the pin metal lines M2(P), or a line extending from the pin metal line M2(P).

As an example, the pin metal lines M2(P) of the second standard cell SC2 may include third interconnection lines MC3_1 and MC3_2, respectively extending toward upper and lower boundaries of the second standard cell SC2. The third interconnection lines MC3_1 and MC3_2 may be upper-level interconnection connected to the pin metal lines M2(P), or lines extending from the pin metal line M2(P). The above-described upper-level interconnection may be connected to the pin metal lines M2(P) by an additional via.

The power distribution patterns M2(PDN) may be adjacent to the net metal lines M2(N) in the second direction Y and may secure a PDN solution without violating a design rule, and is not required to be disposed on a straight line to which the pin metal lines M2(P) extends. Thus, the interconnections such as the first to third interconnection lines MC1, MC2, MC3_1, and MC3_2 may be freely designed without being limited to the design rule to significantly improve routing.

FIGS. 6A, 6B, 6C and 6D are layout diagrams of semiconductor devices according to example embodiments, respectively.

Figure 6A:
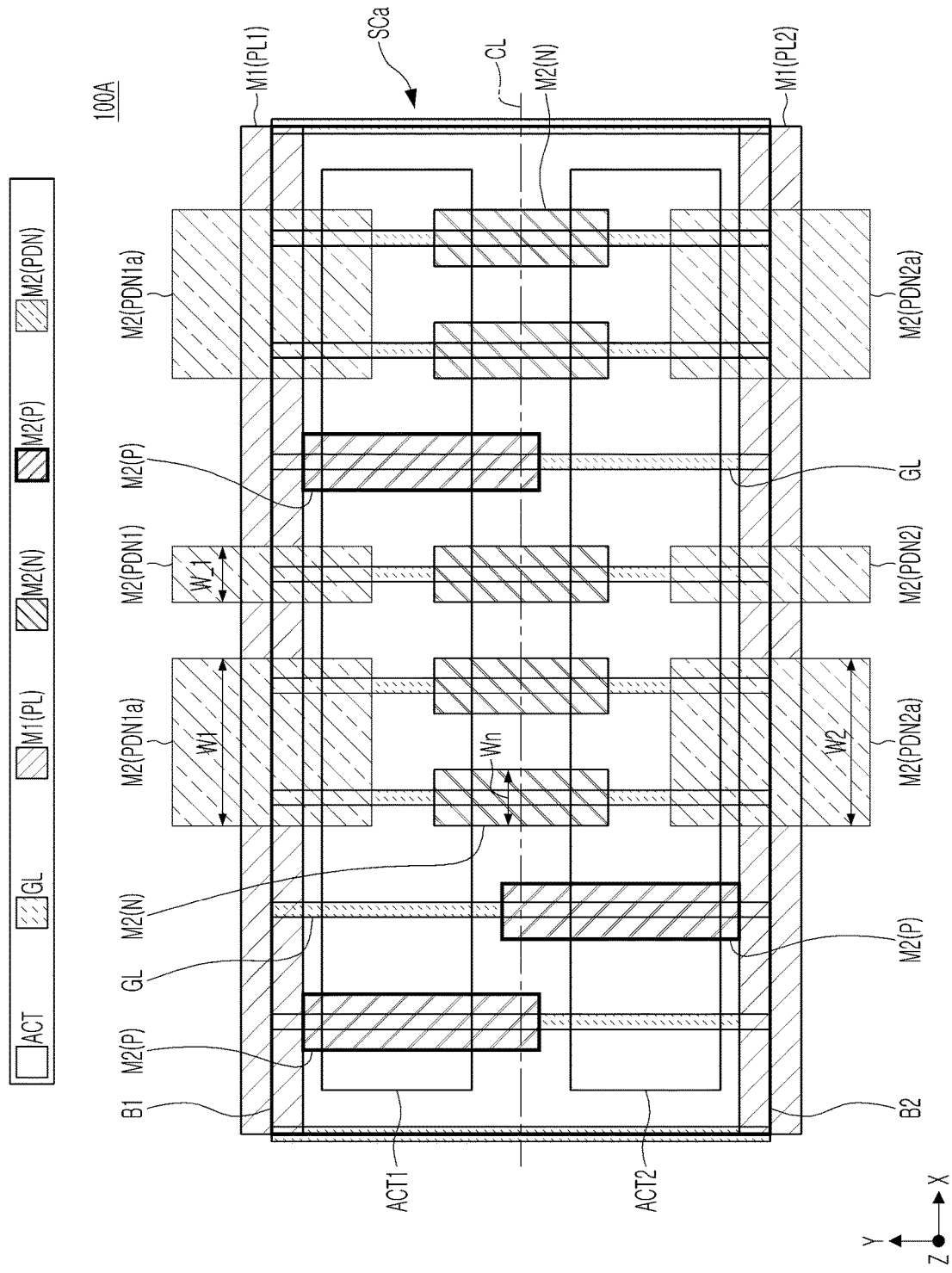
FIGS. 6A, 6B, 6C and 6D are layout diagrams of semiconductor devices according to example embodiments, respectively.

Referring to FIG. 6A, in a standard cell SCa of a semiconductor device 100A, examples of modified shapes of power distribution patterns M2(PDN1a) and M2(PDN2a) are provided.

As an example, at least two net metal lines M2(N) may be disposed between a single first power distribution pattern M2(PDN1a) and a single second power distribution pattern M2(PDN2a). The first and second power distribution patterns M2(PDN1a) and M2(PDN2a), disposed with the at least two net metal lines M2(N) interposed therebetween, may have side surfaces facing each other.

As an example, the first and second power distribution patterns M2(PDN1a) and M2(PDN2a) may have a first width W1 and a second width W2 in a first direction X, respectively. The first width W1 and the second width W2 may be greater than a width Wn of a single net metal line M2(N) in the first direction X.

As an example, the first and second power distribution patterns M2(PDN1a) and M2(PDN1) may have different widths in the first direction X. The semiconductor device 100A may have multiple first power distribution patterns M2(PDN1a) and multiple second power distribution patterns M2(PDN1). A width W1 of one of the first power distribution patterns M2(PDN1a) may be greater than a width W_1 of one of the second power distribution patterns M2(PDN1).

Figure 6B:
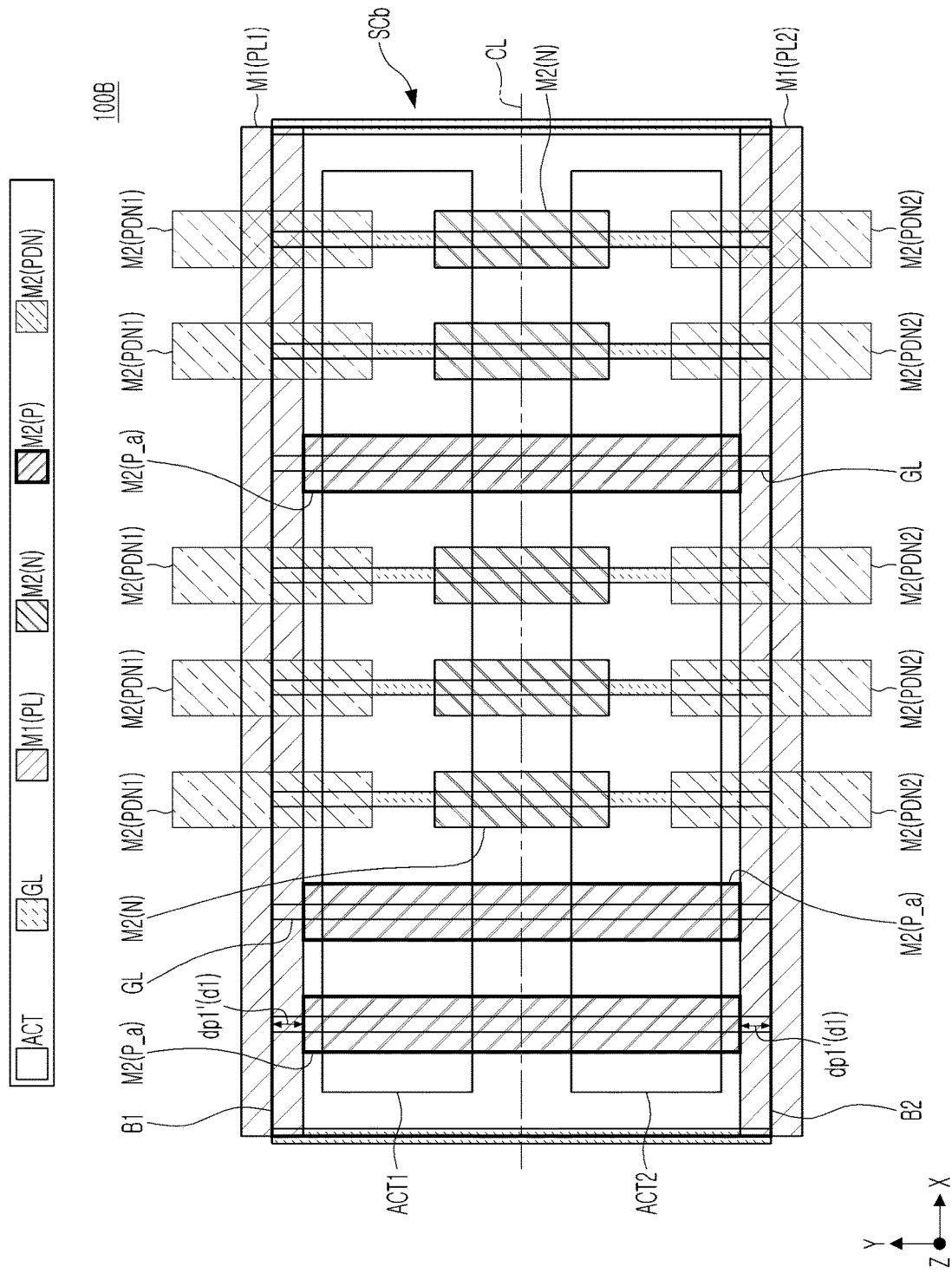

Referring to FIG. 6B, in a standard cell SCb of a semiconductor device 100B, an example of a modified disposition of end portions of pin metal lines M2(P_a) is provided.

The pin metal lines M2(P_a) may extend to a greater length than the net metal lines M2(N). End portions of the pin metal lines M2(P_a) in a second direction Y may be disposed to be closer to a first boundary B1 and a second boundary B2 than end portions of the net metal lines M2(N) in the second direction Y, respectively.

A distance dp1 'between a first end portion of the pin metal lines M2(P_a), adjacent to the first boundary B1, and the first boundary B1 may be the same as a distance dp2' between a second end portion of the pin metal lines M2(P_a), adjacent to the second boundary B2, and the second boundary B2. The distances dp1' and dp2' may be smaller than spacing distances dn1 and dn2 between the net metal lines M2(N) and the first and second boundaries B1 and B2.

The pin metal lines M2(P_a) and net metal lines M2(N) may be disposed based on the same distance design rule as described with reference to FIG. 4B. For example, a small distance d1 of the distances dp1' and dp2' may satisfy $0 \le d1 < d\_c$ in relation to the above-mentioned criteria distance d_c, and the pin metal lines M2(P_a) may disposed to satisfy the same.

Figure 6C:
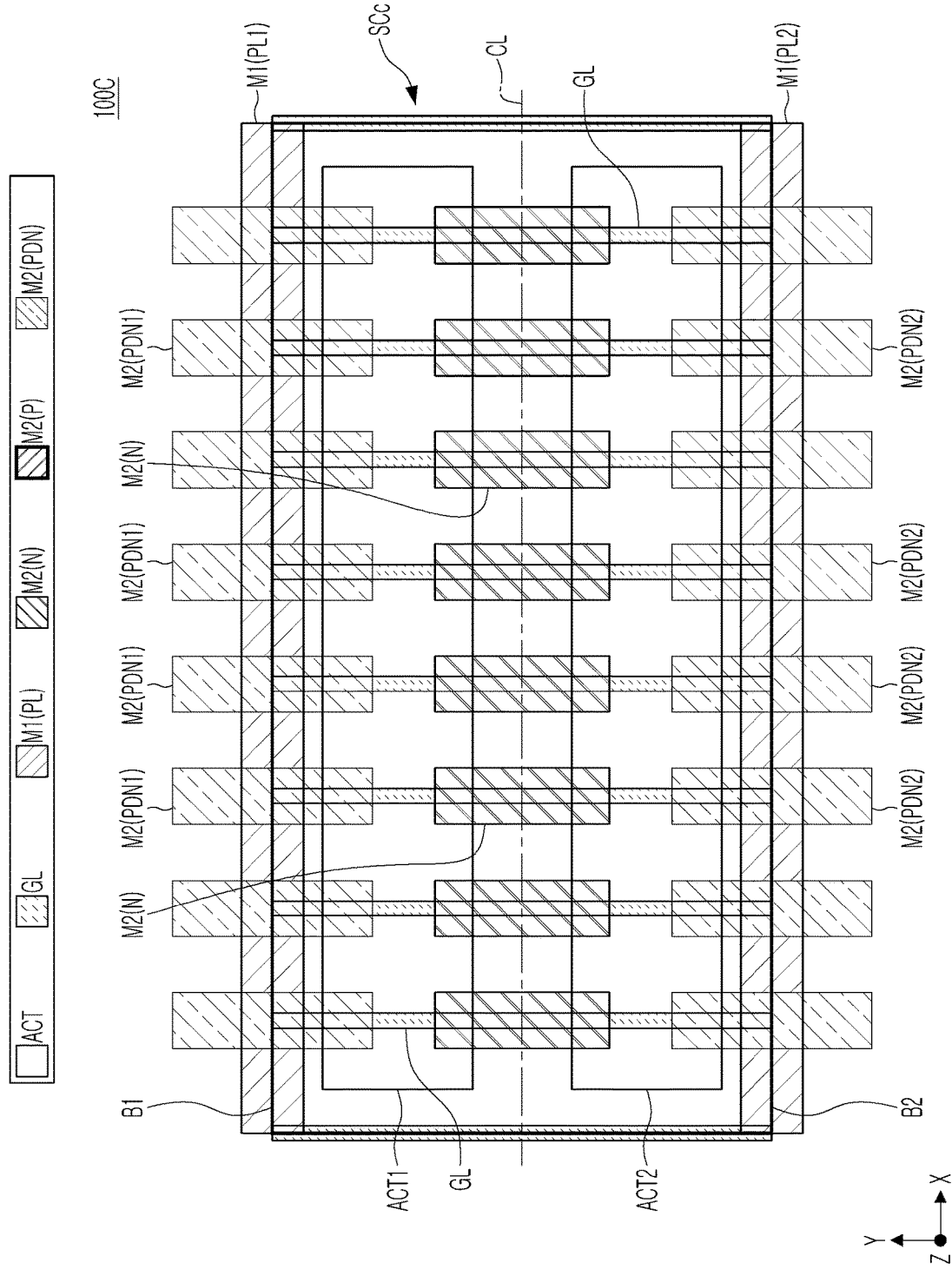

Referring to FIG. 6C, in a standard cell SCc of a semiconductor device 100C, an example in which the pin metal lines M2(P) are omitted is provided. Net metal lines M2(N) may be disposed such that a center of each of the net metal lines M2(N) is disposed on a central axis CL between a first boundary B1 and a second boundary B2 of the standard cell SCc. The first and second power distribution patterns M2(PDN1) and M2(PDN2) may be disposed to face both end portions of each of the net metal lines M2(N), and thus, a PDN solution may be secured.

Figure 6D:
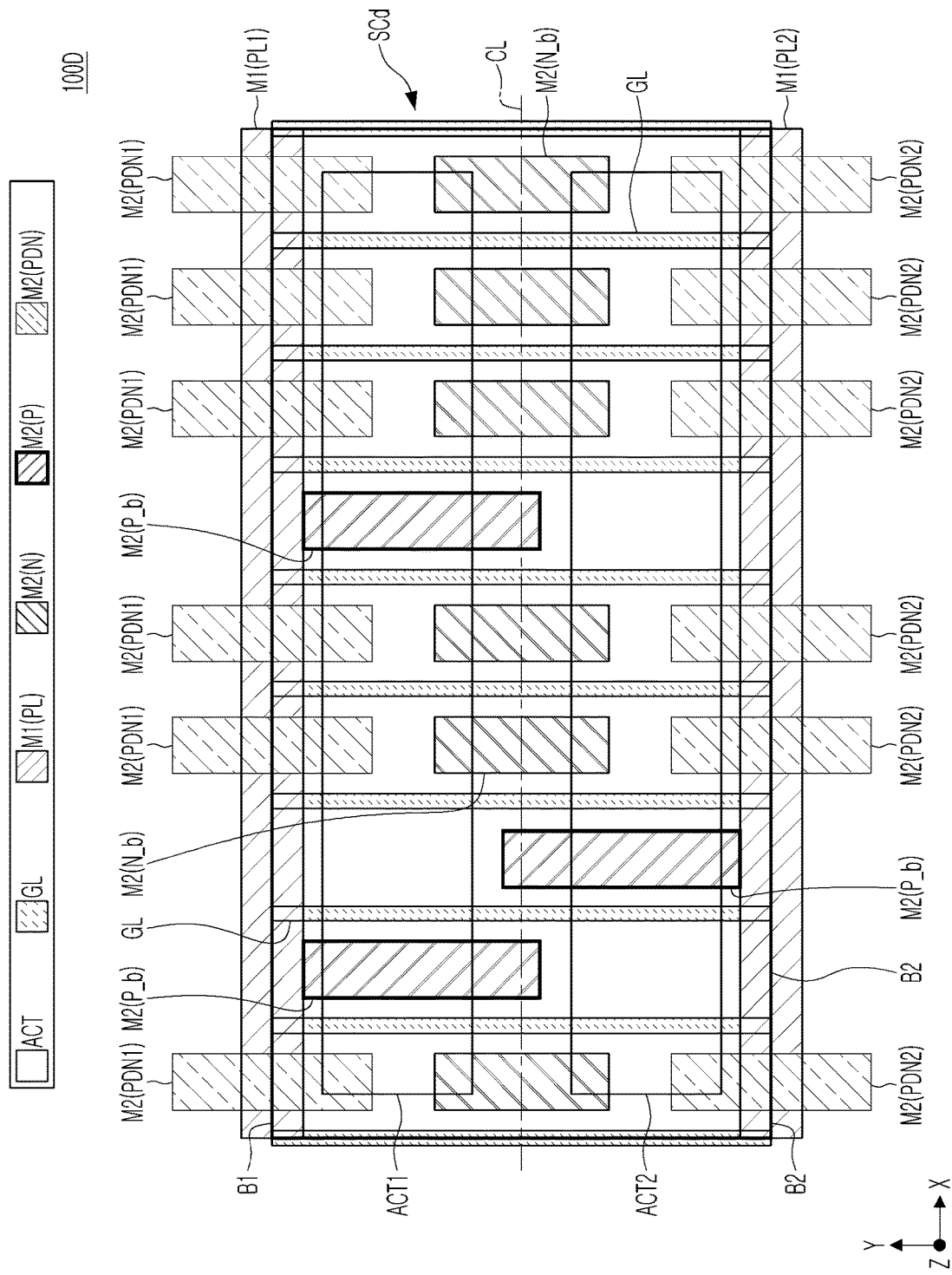

Referring to FIG. 6D, in a standard cell SCd of a semiconductor device 100D, examples of modified disposition of pin metal lines M2(P_b) and net metal lines M2(N_b) is provided.

As described above with reference to FIG. 6C, a portion of the net metal lines M2(N) and the pin metal lines M2(P) may be disposed to overlap the gate lines GL. As shown in FIG. 6D, net metal lines M2(N_b) and the pin metal lines M2(P_b) may be disposed so as not to overlap gate lines GL.

Figure 7:
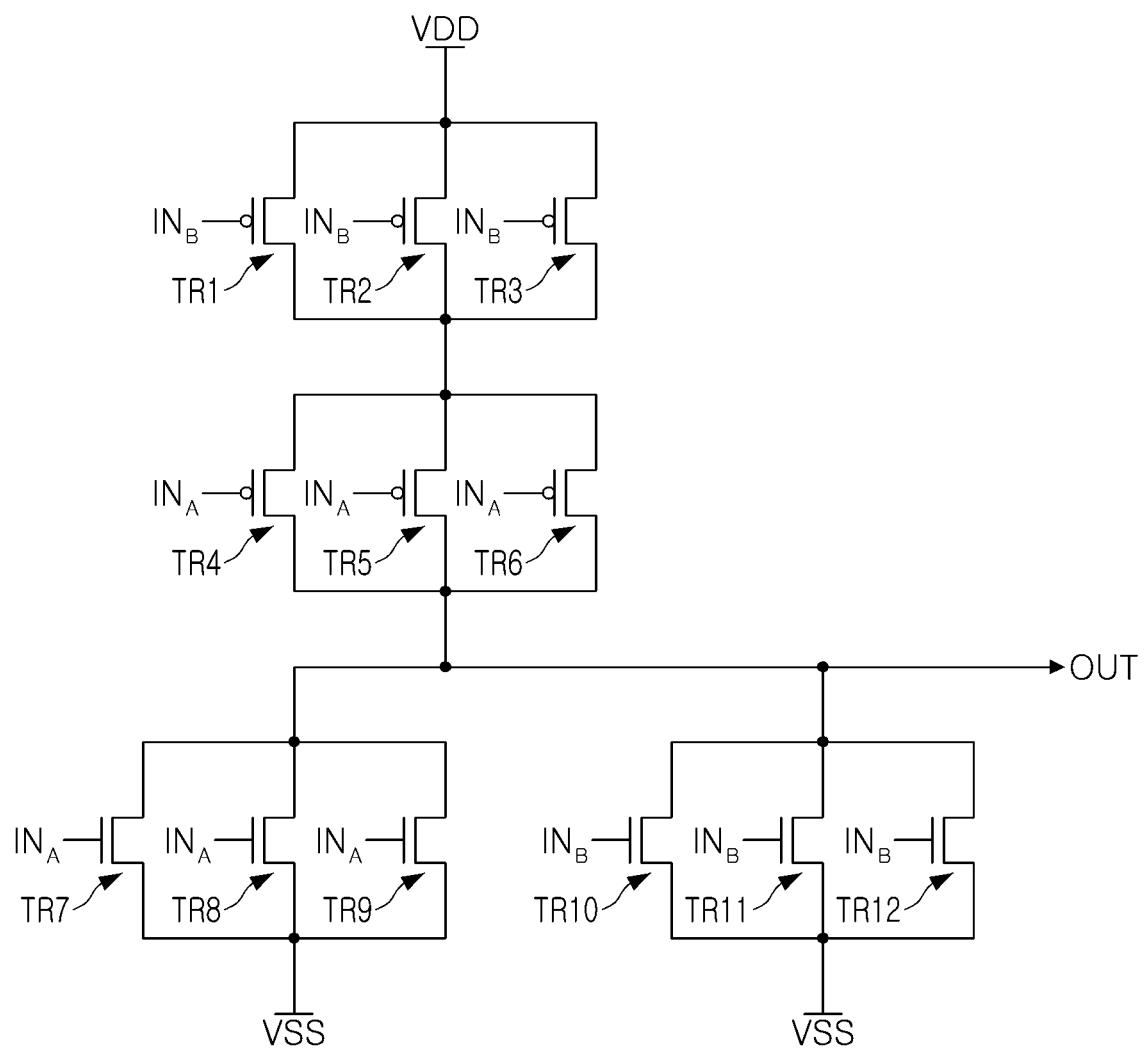
FIG. 7 is a circuit diagram provided by a standard cell included in a semiconductor device according to example embodiments.

FIG. 7 is a circuit diagram provided by a standard cell included in a semiconductor device according to example embodiments.

Referring to FIG. 7, three NOR unit circuits may be connected to each other in parallel.

A NOR circuit may include first to third transistors TR1, TR2, and TR3 supplied with first power VDD and connected to each other in parallel, fourth to sixth transistors TR4, TR5, and TR6 connected to the first to third transistors TR1, TR2, and TR3 in series and connected to each other in parallel, seventh to ninth transistors TR7, TR8, and TR9 supplied with second power VSS and connected to each other in parallel, and tenth to twelfth transistors TR10, TR11, and TR12 supplied with the second power VSS and connected to each other in parallel.

The first power VDD may be applied to an active region, shared by the first and second transistors TR1 and TR2, and an active region of the third transistor TR3. The second power VSS may be applied to an active region of the seventh transistor TR7, an active region of the twelfth transistor TR12, an active region shared by the eighth and ninth transistors TR8 and TR9, and an active region shared by the tenth and eleventh transistors TR10 and TR11.

Gates of the fourth to sixth transistors TR4, TR5, and TR6 and the seventh to ninth transistors TR7, TR8, and TR9 may be connected to each other to provide a first input terminal $IN_A$, and gates of the third to third transistors TR1, TR2, and TR3 and the tenth to twelfth transistors TR10, TR11, and TR12 may be connected to each other to provide a second input terminal $IN_B$.

Drain regions, among source/drain regions on active regions of the fourth to sixth transistors TR4, TR5, and TR6, drain regions, among source/drain regions on active regions of the seventh to ninth transistors TR7, TR8, and TR9, and drain regions, among source/drain regions on active regions of the tenth to twelfth transistors TR10, TR11, and TR12, may be connected to each other to provide an output terminal OUT.

FIGS. 8A to 8I are layout diagrams of a semiconductor device according to example embodiments. For ease of description, FIGS. 8A to 8H sequentially illustrate components included in a layout of a standard cell of the semiconductor device. FIGS. 8A to 8H illustrate a standard cell including the NOR circuit of FIG. 7.

Figure 8A:
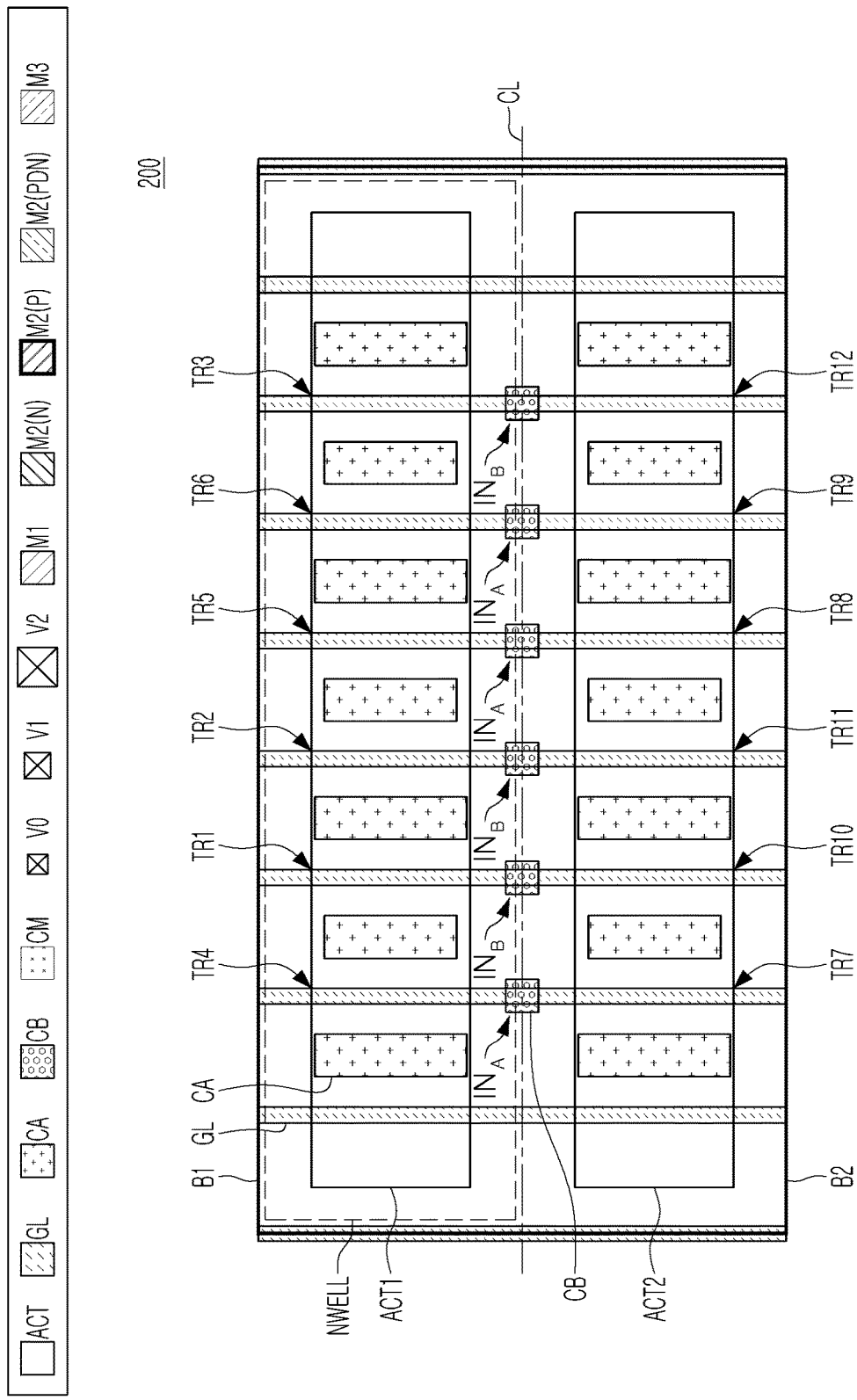
FIGS. 8A, 8B, 8C, 8D, 8E, 8F, 8G, 8H and 8I are layout diagrams of a semiconductor device according to example embodiments.

Referring to FIG. 8A, a standard cell of a semiconductor device 200 may include well regions such as N-well regions NWELL, active regions ACT1 and ACT2 extending in a first direction X, gate lines GL extending in a second direction Y, contact structures CA connected to the active regions ACT1 and ACT2, and a gate contact structure CB connected to gate lines GL.

A plurality of transistors may be formed in a standard cell SC. For example, FIGS. 8A to 8H illustrate layouts of the NOR circuit of FIG. 7, and corresponding first to twelfth transistors TR1 to TR12 are illustrated in FIG. 8A. A corresponding relationship between a plurality of transistors of the standard cell SC and the transistors of FIG. 7 will be further understood with reference to FIGS. 8B to 8H in which other interconnections and vias are further illustrated. The gate lines GL may be connected to the first and second input terminals $IN_A$ and $IN_B$ of FIG. 7 through each of the gate contact structures CB, and thus, a first input signal and a second input signal may be applied to each of the gate lines GL.

Figure 8B:
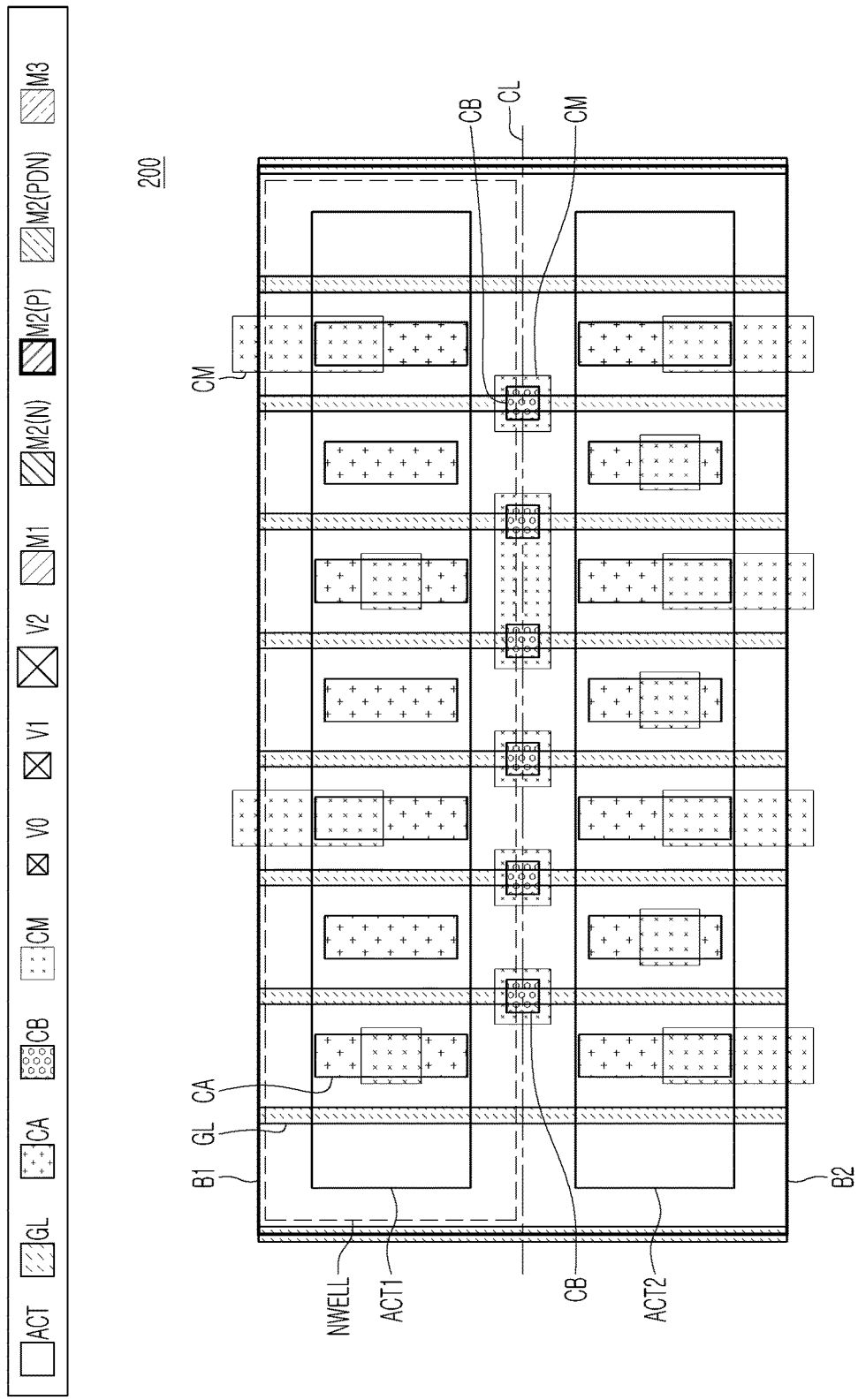

In FIG. 8B, an interconnection line CM is further illustrated in the layout of the standard cell of the semiconductor device 200 of FIG. 8A. The interconnection line CM may be an interconnection connecting the contact structure CA on the active regions ACT1 and ACT2 to power supply lines M1(PL1) and M1(PL2), an interconnection connecting a contact structure CA on the active regions ACT1 and ACT2 to signal lines M1(S), or an interconnection connecting a gate contact structure CB to the signal lines M1(S).

Figure 8C:
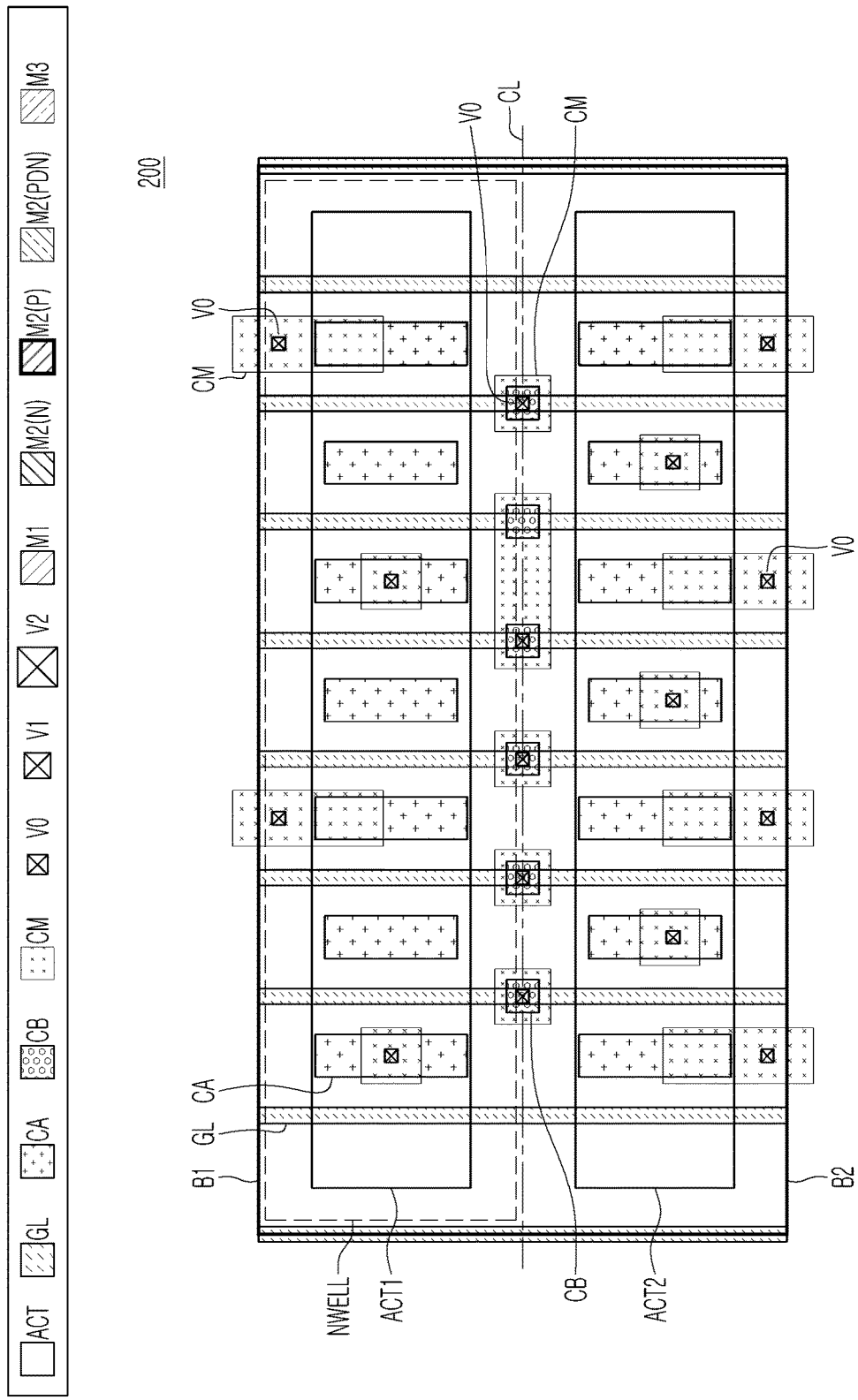

In FIG. 8C, lower vias V0 are further illustrated in the layout of the standard cell of the semiconductor device 200 of FIG. 8B. The lower vias V0 may include lower power vias, first lower connection vias, and second lower connection vias. The lower power vias may connect an interconnection line CM on the contact structure CA to the power supply lines M1(PL1) and M1(PL2). The first lower connection vias may connect an interconnection line CM on the gate contact structure CA to the signal lines M1(S). The second lower connection vias may connect the interconnection line CM on the contact structure CA to the signal lines M1(S).

Figure 8D:
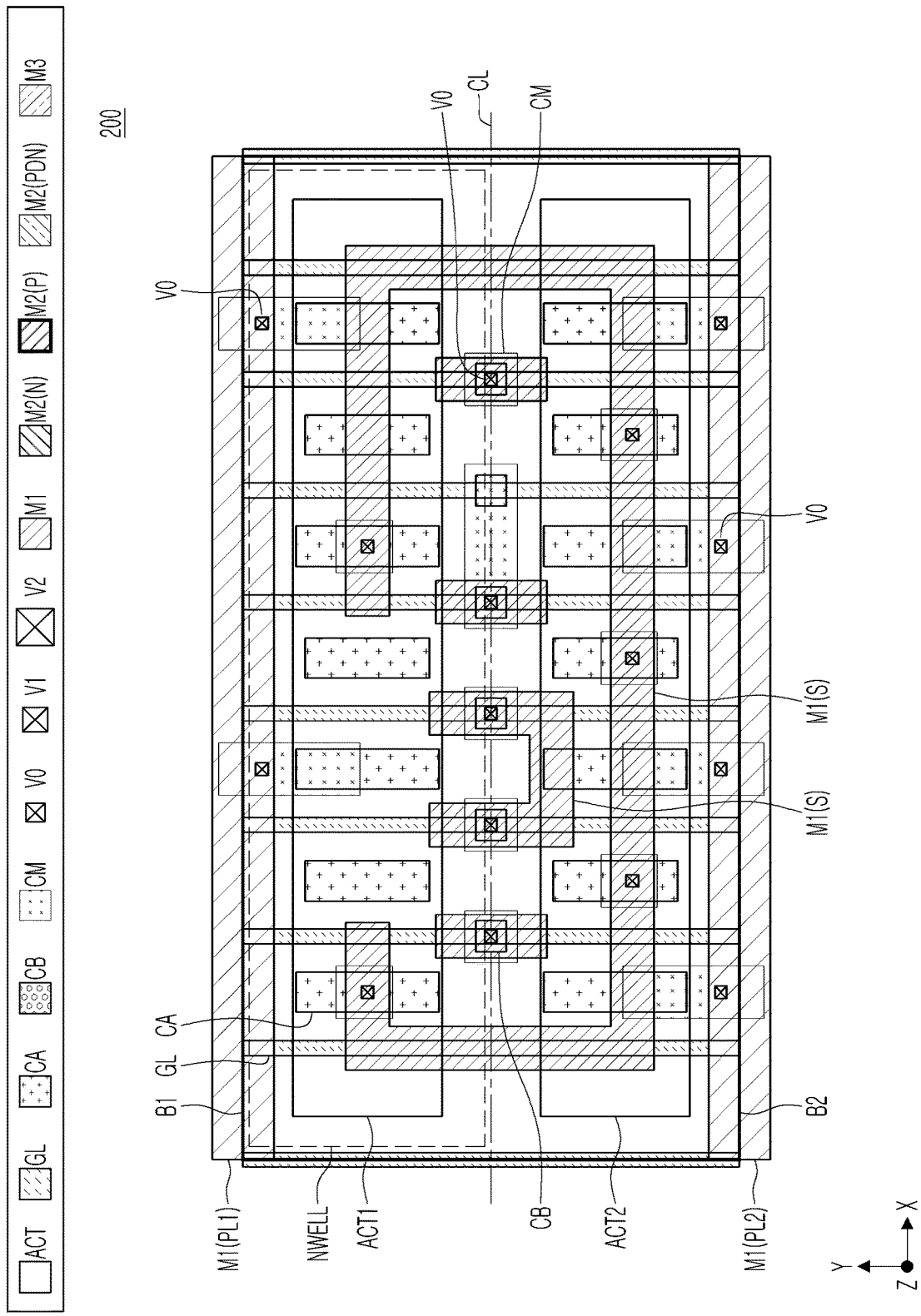

In FIG. 8D, the first conductive structure M1 is further illustrated in the layout of the standard cell of the semiconductor device 200 of FIG. 8C. The first conductive structure M1 may include first and second power supply lines M1(PL1) and M1(PL2) and signal lines M(S).

The first and second power supply lines M1(PL1) and M1(PL2) may be connected to the lower power vias, among the lower vias V0, to supply power to the active regions ACT1 and ACT2.

Some of the signal lines M1(S) may be connected to the first lower connection vias, among the lower vias V0, to apply signals ($IN_A$, $IN_B$ of FIG. 7) to the gate lines GL.

Some of the signal lines M1(S) may be connected to the second lower connection vias among the lower vias V0 and connected to the output terminal OUT. For example, referring to FIGS. 7, 8A, and 8H together, some of the signal lines M1(S) may be connected to drain regions of the fourth to sixth transistors TR4, TR5, and TR6 and drain regions of the seventh to twelfth transistors TR7, TR8, TR9, TR10, TR11, and TR12, and may be connected to an output terminal OUT by the pin metal lines M2(P) disposed thereon.

Figure 8E:
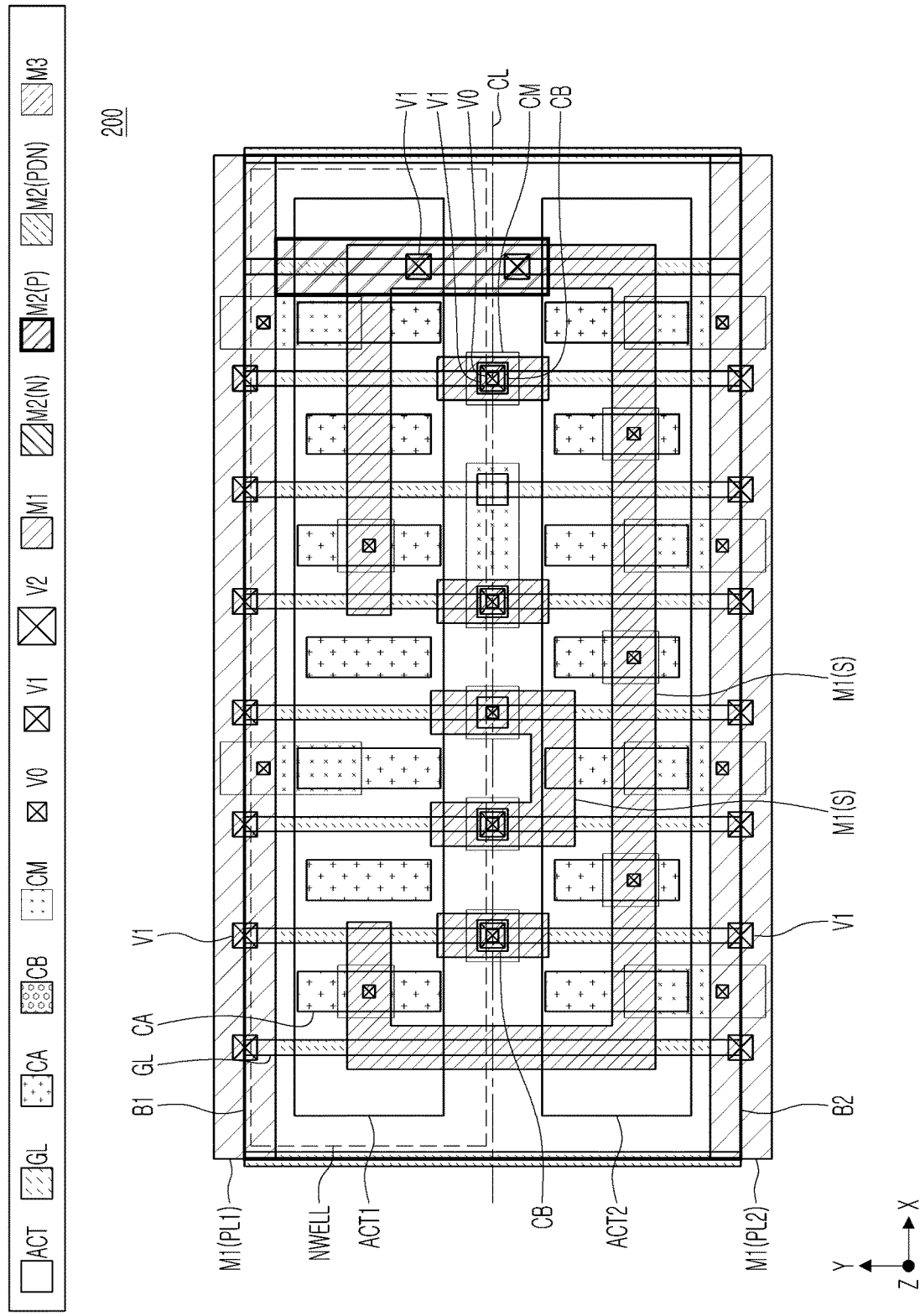

In FIG. 8E, first vias V1 are further illustrated in the layout of the standard cell of the semiconductor device 200 of FIG. 8D. The first vias V1 may include first power vias, connected to the first and second power supply lines M1(PL1) and M1(PL2), and first connection vias connected to the signal lines M1(S). Each of the first vias V1 is illustrated as having a larger size than each of the lower vias V0, but example embodiments are not limited thereto. In particular, the size difference is provided to distinguish components from each other.

Figure 8F:
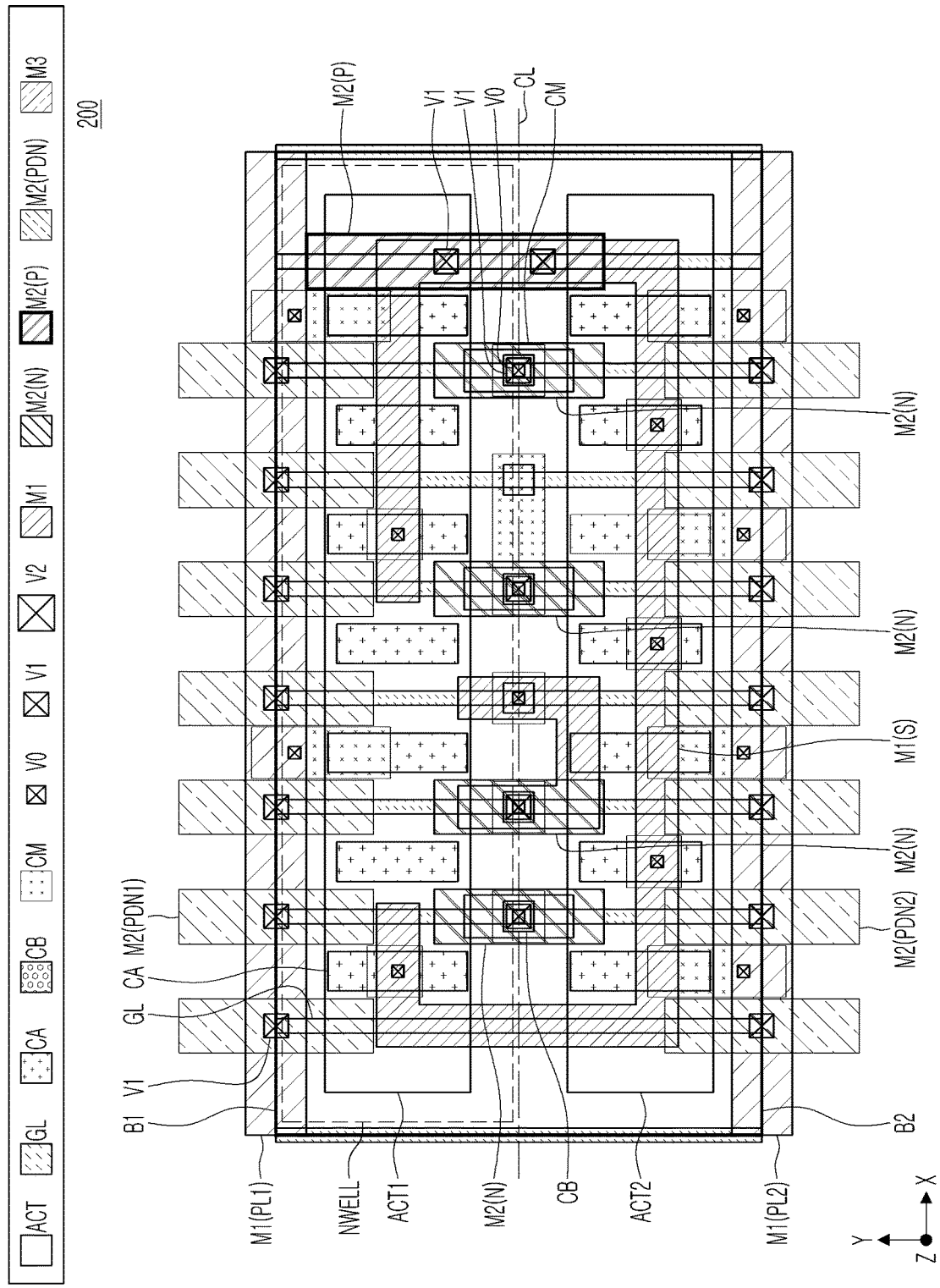

In FIG. 8F, a second conductive structure M2 may be included in the layout of the standard cell of the semiconductor device 200 of FIG. 8E. The second conductive structure M2 may include net metal lines M2(N), pin metal lines M2(P), and first and second power distribution patterns M2(PDN1) and M2(PDN2).

The first and second power distribution patterns M2(PDN1) and M2(PDN2) may be connected to the first power vias, among the first vias V1, to supply power transferred from upper-level interconnections to the first and second power supply lines M1(PL1) and M1(PL2).

The net metal lines M2(N) may be connected to first connection vias, among the first vias V1, to connect some of the gate lines GL to each other. The net metal lines M2(N) may be disposed between the first and second power distribution patterns M2(PDN1) and M2(PDN2). The net metal lines M2(N) may not be disposed between some of the first and second power distribution patterns M2(PDN1) and M2(PDN2).

The pin metal lines M2(P) may be connected to first connection vias, among the first vias V1, to connect some of the active regions ACT1 and ACT2 to each other. The pin metal lines M2(P) may be included in a routing structure for connection to other standard cells, and may provide the output terminal OUT of FIG. 7. A placement relationship of the second conductive structure M2 will be described again with reference to FIG. 8I.

Figure 8G:
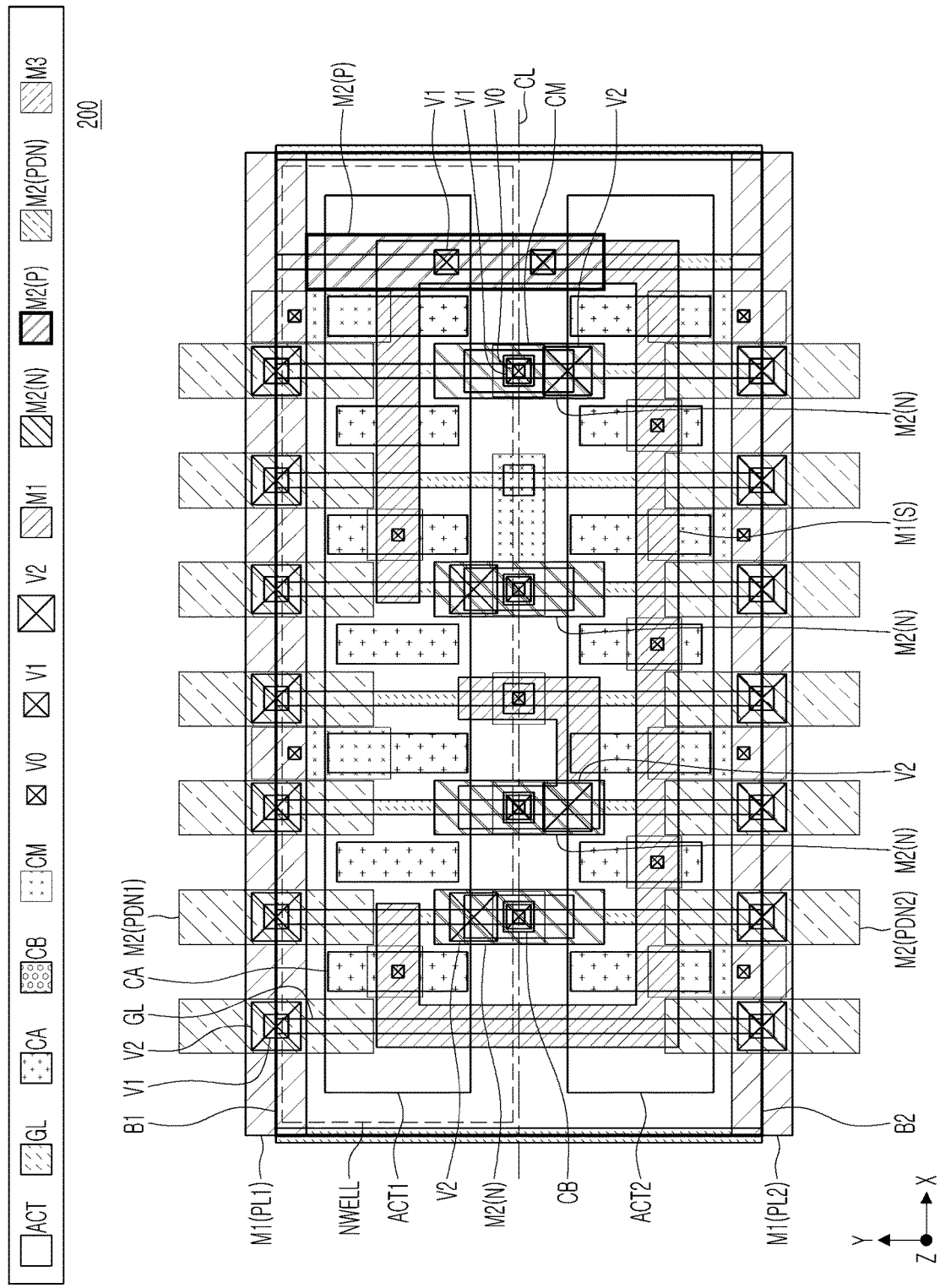

In FIG. 8G, second vias V2 are further illustrated in the layout of the standard cell of the semiconductor device 200 of FIG. 8F. The second vias V2 may include second power vias, connected to first and second power distribution patterns M2(PDN1) and M2(PDN2), and second connection vias connected to the net metal lines M2(N). Each of the second vias V2 is illustrated as having a larger size than each of the first vias V1, but example embodiments are not limited thereto. In particular, the size difference is provided to distinguish components from each other.

Figure 8H:
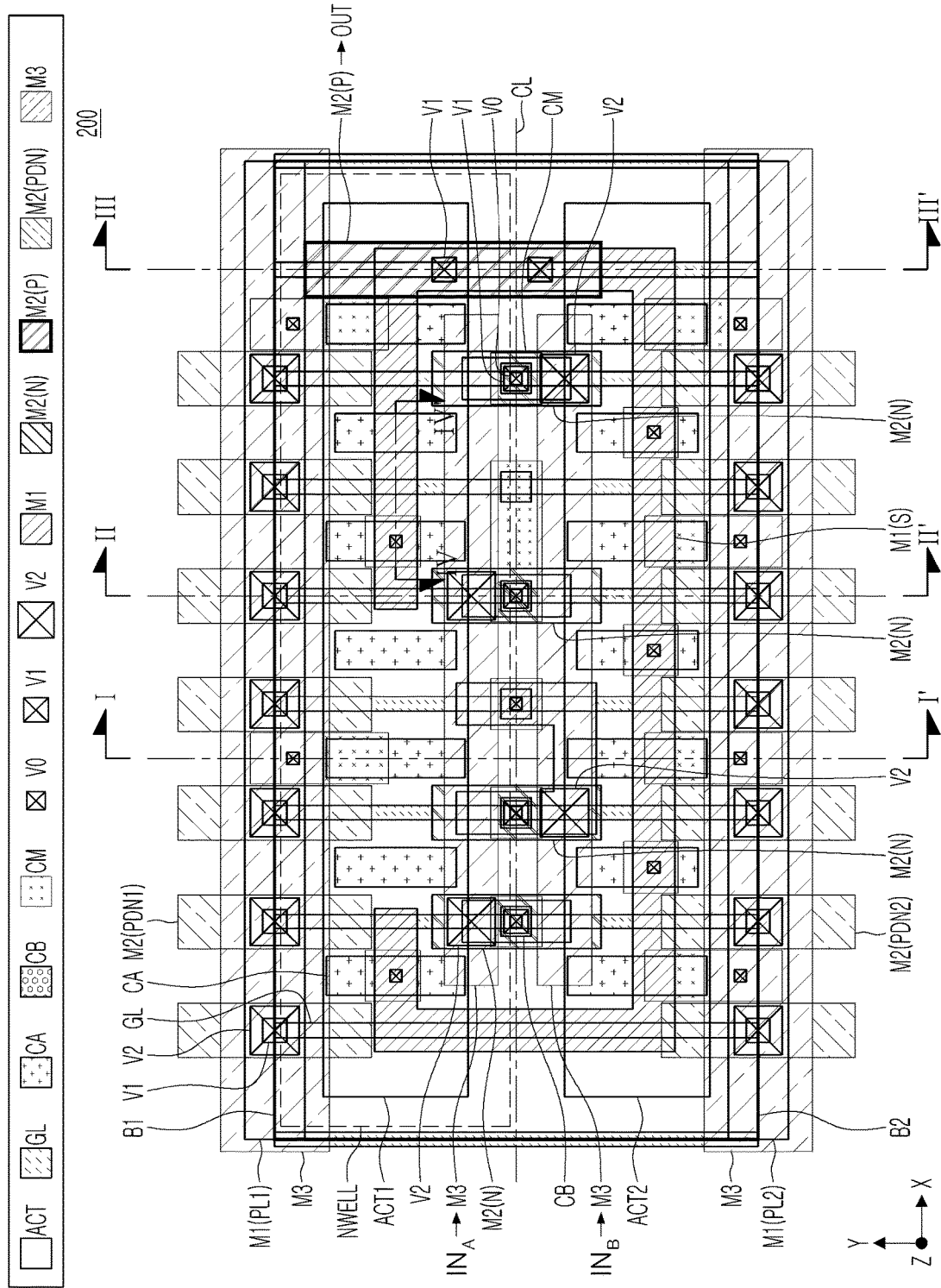

In FIG. 8H, a third conductive structure M3 is further illustrated in the layout of the standard cell of the semiconductor device 200 of FIG. 8G. The third conductive structure M3 may be disposed to overlap the first and second power supply lines M1(PL1) and M1(PL2), and may include metal lines, extending in a first direction X, and metal lines connecting some of the net metal lines M2(N) to each other and extending in the first direction X.

Some of the third conductive structures M3 may be connected to the first input terminal INA to apply a first input signal to gates of the fourth to ninth transistors TR4, TR5, TR6, TR7, TR8, and TR9, and some of the third conductive structures M3 may be connected to the second input terminal INB to apply a second input signal to gates of the first to third transistors TR1, TR2, and TR3 and gates of the tenth to twelfth transistors TR10, TR11, and TR12.

Figure 8I:
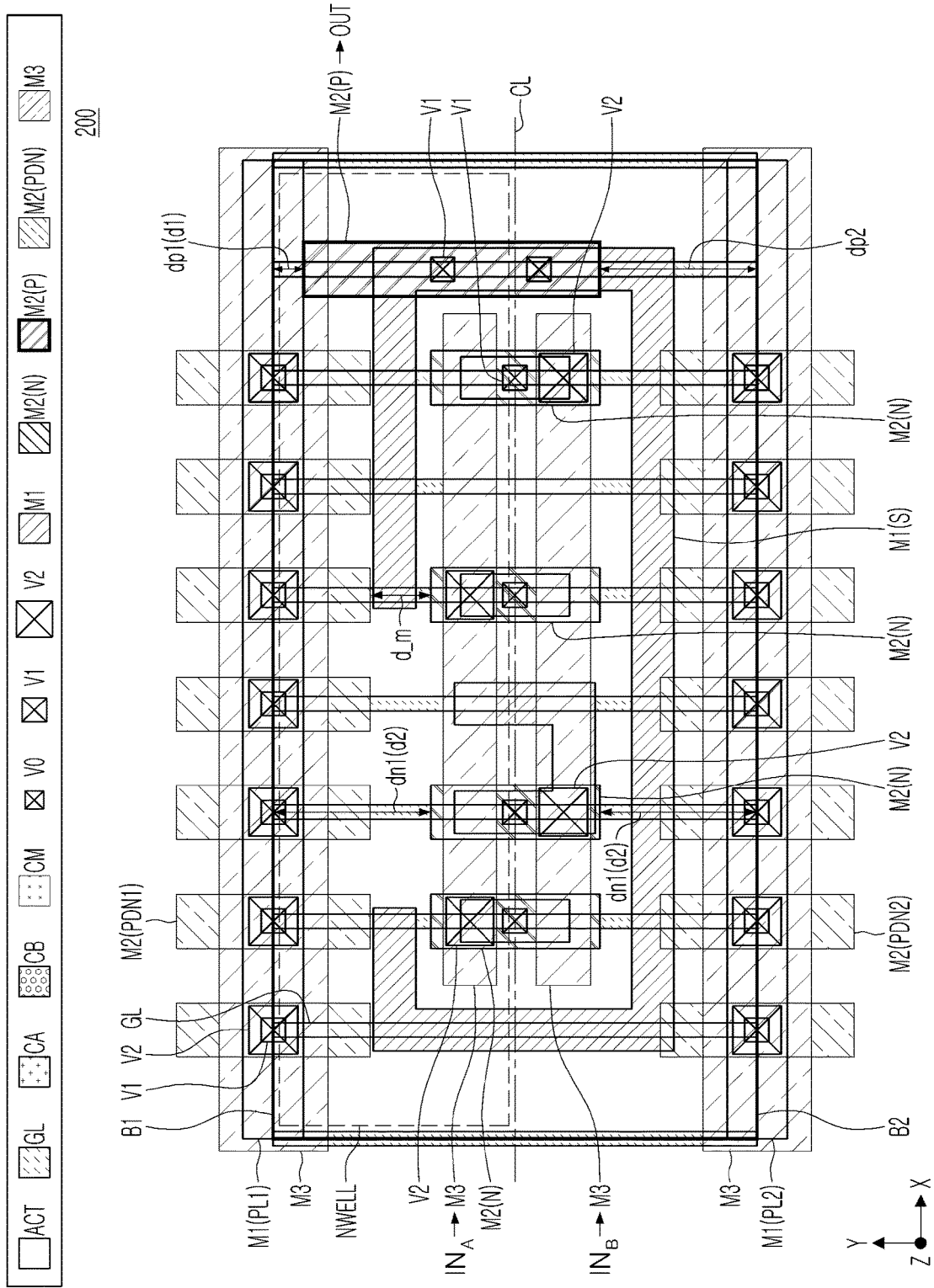

FIG. 8I is a portion of the layout diagram of the semiconductor device according to example embodiments. In FIG. 8I, some components are omitted from the layout diagram of the standard cell of the semiconductor device 200 of FIG. 8H to describe the placement relationship of the second conductive structure M2.

Components of the second conductive structure M2 may be disposed based on the distance design rule described with reference to FIGS. 3 to 4C. For example, the pin metal lines M2(P) may be disposed to be closer to or farther from at least one of the first and second boundaries B1 and B2 of the standard cell SC than the net metal lines M2(N). For example, the pin metal lines M2(P) may be disposed based on a distance design rule satisfying $0 \leq d1 < d\_c$, and the net metal lines M2(N) may be disposed based on a distance design rule satisfying $d2 \geq d\_c$.

FIGS. 9A to 9E are cross-sectional views of a semiconductor device according to example embodiments. FIGS. 9A to 9D illustrate exemplary cross sections of the semiconductor device 200 taken along lines I-I', II-II', III-III', and IV-IV' of FIG. 8H, respectively. For ease of description, not all components of the semiconductor device 200 are illustrated in FIGS. 9A to 9D.

Referring to FIGS. 9A to 9D, the semiconductor device 200 includes a substrate 101, active regions ACT1 and ACT2 each including active fins 105, a device isolation layer 110, source/drain regions 120, gate structures 140 each including a gate electrode layer 145, a lower interlayer insulating layer 130, a contact structure CA, a gate contact structure CB, interconnection lines CM, an upper interlayer insulating layer 150, a lower via V0, a first conductive structure M1, first vias V1 disposed on the first conductive structure M1, a second conductive structure M2, second vias V2, and a second conductive structure M3. The semiconductor device 200 may further includes etch-stop layers 160, disposed on a lower surface of the upper interlayer insulating layer 150, and barrier layers 170 disposed along lower surfaces of the conductive structures M1, M2, M3 and the vias V0, V1, V2. The semiconductor device 200 may include FinFET elements, transistors in which the active regions ACT1 and ACT2 include active fins 105 having a fin structure.

The substrate 101 may have an upper surface extending in a first direction X and a second direction Y. The substrate 101 may include a semiconductor material such as a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon-on-insulator (SOI) layer, or a semiconductor-on-insulator (SeOI) layer. The substrate 101 may include doped regions such as an N-well region NWELL.

Figure 9A:
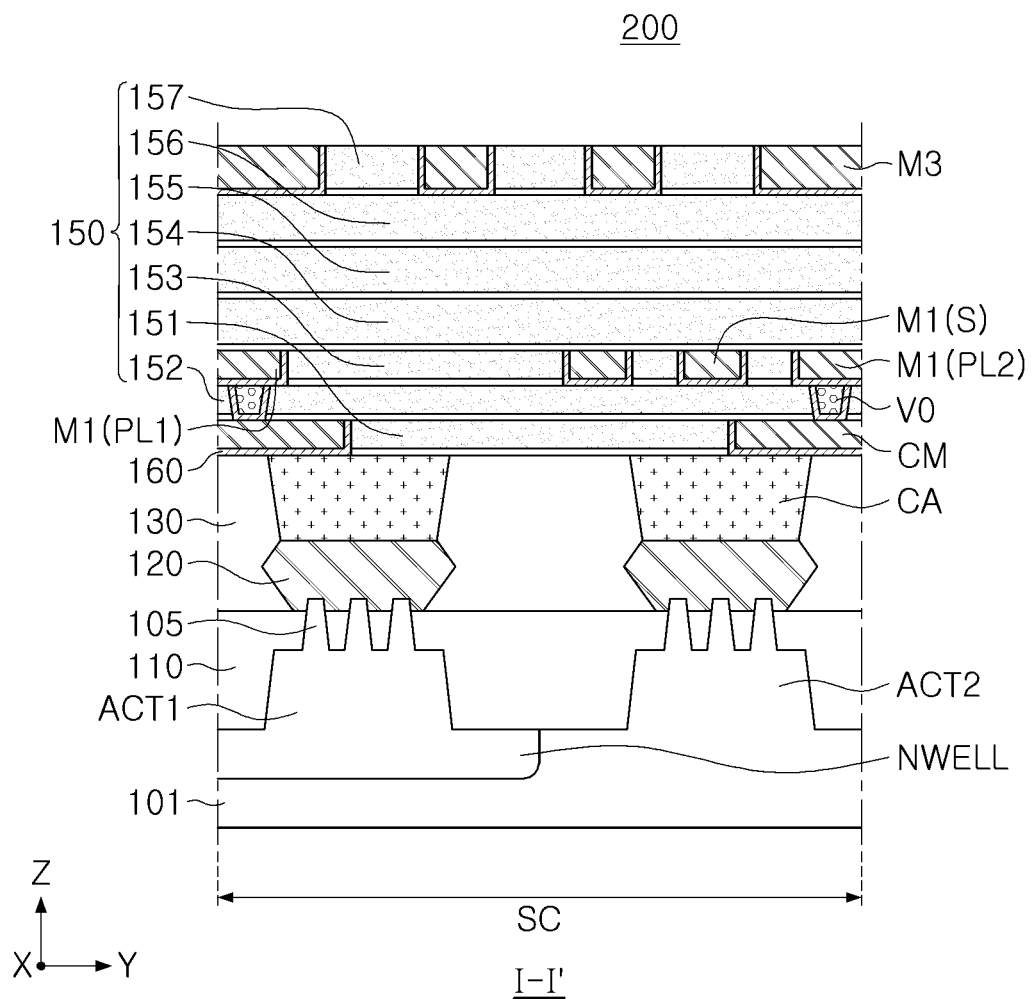
FIGS. 9A, 9B, 9C, 9D and 9E are cross-sectional views of a semiconductor device according to example embodiments.
Figure 9B:
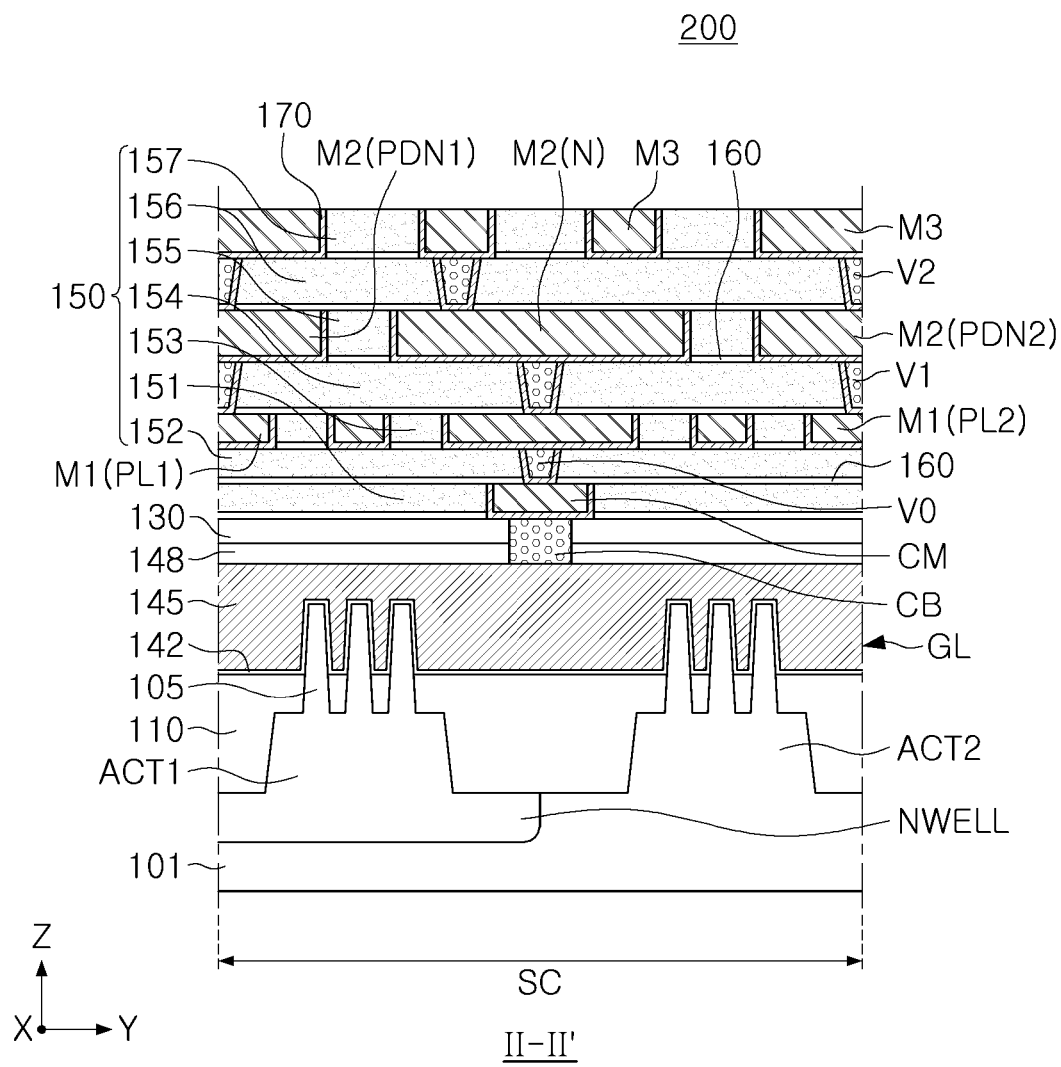
Figure 9C:
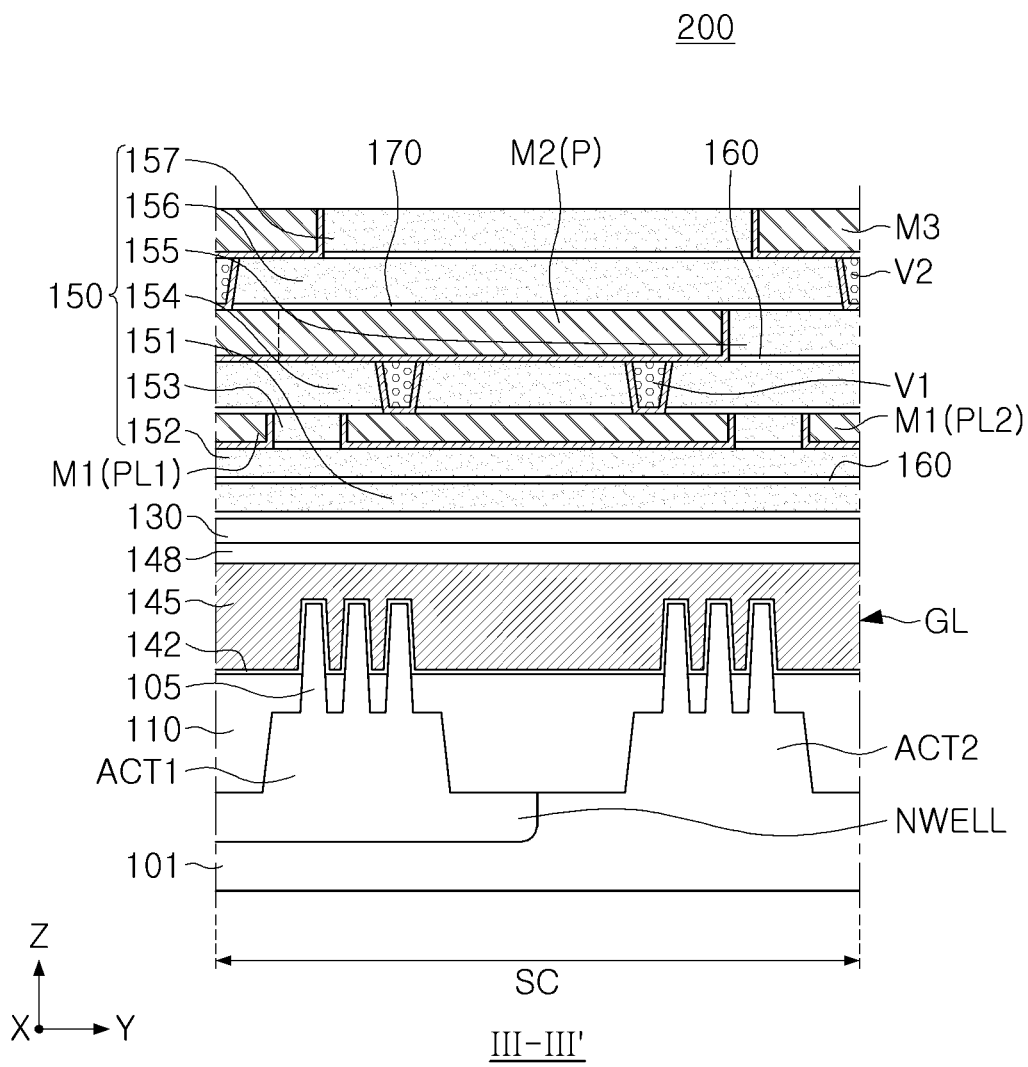
Figure 9D:
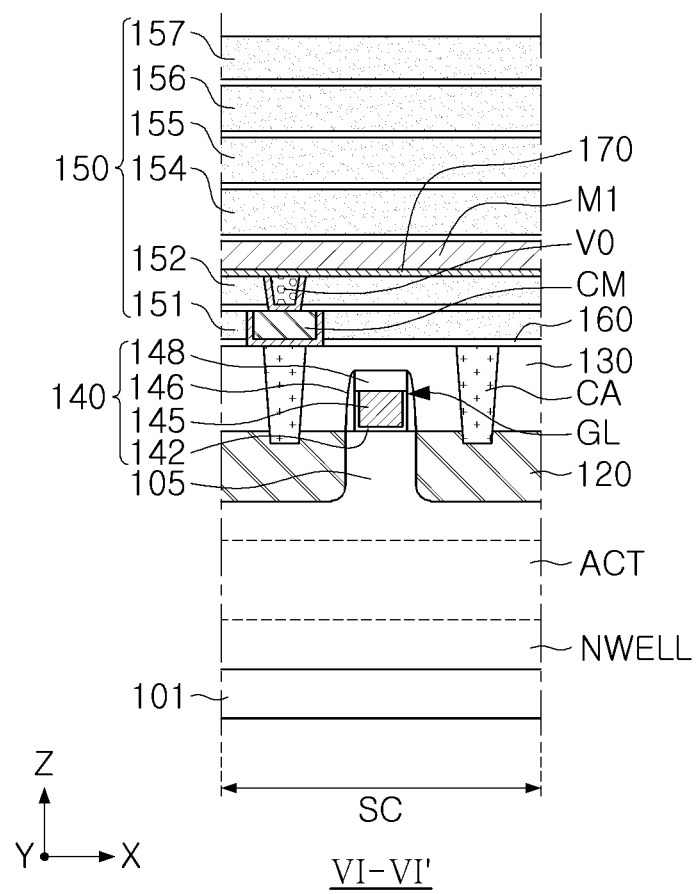

The device isolation layer 110 may define active regions ACT in the substrate 101. The device isolation layer 110 may be formed by, for example, a shallow trench isolation (STI) process. As illustrated in FIG. 9A, the device isolation layer 110 may include a region extending to a greater depth downwardly of the substrate 101 between adjacent active regions ACT, but example embodiments are not limited thereto. According to example embodiments, the device isolation layer 110 may have a curved upper surface having a level that increases with proximity to the active fins 105. The device isolation layer 110 may be formed of an insulating material and may include, for example, an oxide, a nitride, or a combination thereof.

The active regions ACT1 and ACT2 may be defined (i.e., separated) by the device isolation layer 110 in the substrate 101 and may be disposed to extend in the first direction X. The active fins 105 may have a shape protruding from the substrate 101. Upper ends of the active fins 105 may be disposed to protrude from the upper surface of the device isolation layer 110 to a predetermined height. The active fins 105 may be provided as a portion of the substrate 101, or may include an epitaxial layer grown from the substrate 101. A portion of the active fins 105 may be recessed on opposite sides of the gate structures 140, and source/drain regions 120 may be disposed on the recessed active fins 105. According to example embodiments, the active regions ACT1 and ACT2 may have doped regions including impurities. For example, the active fins 105 may include impurities diffused from the source/drain regions 120 in a region in contact with the source/drain regions 120. In example embodiments, the active fins 105 may be omitted. In this case, the active regions ACT1 and ACT2 may have a planar upper surface.

The source/drain regions 120 may be disposed on recess regions, in which the active fins 105 are recessed, on the opposite sides of the gate structures 140. The source/drain regions 120 may be provided as source regions or drain regions of transistors. Upper surfaces of the source/drain regions 120 may be disposed on the same (or similar) height level as lower surfaces of the gate structures 140 in a cross section in the first direction X of FIG. 9D. However, relative heights of the source/drain regions 120 and the gate structures 140 may be changed in various manners according to example embodiments.

As illustrated in FIG. 9A, the source/drain regions 120 may have a merged shape in which they are connected to each other between adjacent active fins 105 in the second direction Y, but example embodiments are not limited thereto. The source/drain regions 120 may have angular side surface in a cross section in the second direction Y of FIG. 9A. However, in example embodiments, the source/drain regions 120 may have various shapes, and may have one of, for example, polygonal, circular, elliptical, and rectangular shapes.

The source/drain regions 120 may include an epitaxial layer, and may include, for example, silicon (Si), silicon germanium (SiGe), or silicon carbide (SiC). The source/drain regions 120 may further include impurities such as arsenic (As) and/or phosphorus (P). In example embodiments, the source/drain regions 120 may include a plurality of regions including elements having different concentrations and/or doping elements.

The gate structures 140 may be disposed on the active regions ACT1 and ACT2 to intersect the active regions ACT1 and ACT2 and extend in the second direction Y. Channel regions of transistors may be formed in the active fins 105 intersecting the gate structures 140. The gate structure 140 may include a gate insulating layer 142, a gate electrode layer 145, gate spacer layers 146, and a gate capping layer 148.

The gate insulating layer 142 may be disposed between the active fin 105 and the gate electrode layer 145. In example embodiments, the gate insulating layer 142 may include a plurality of layers, or may be disposed to extend upwardly of a side surface of the gate electrode layer 145. The gate insulating layer 142 may include an oxide, a nitride, or a high-k dielectric material. The high-k dielectric material may refer to a dielectric material having a higher dielectric constant than a silicon oxide ($SiO_2$).

The gate electrode layer 145 may include a conductive material and may include, for example, a metal nitride such as a titanium nitride (TiN), tantalum nitride (TaN), or tungsten nitride (WN), and/or a metal such as aluminum (Al), tungsten (W), or molybdenum (Mo), or a semiconductor material such as doped polysilicon. The gate electrode layer 145 may include two or more layers. The gate electrode layer 145 may include portions disposed to be separated from each other in the second direction Y between at least some adjacent transistors, depending on a circuit configuration of the semiconductor device 200. For example, the gate electrode layer 145 may be separated by an additional gate separation layer.

The gate spacer layers 146 may be disposed on opposite side surfaces of the gate electrode layer 145. The gate spacer layers 146 may insulate the source/drain regions 120 from the gate electrode layer 145. According to example embodiments, the gate spacer layers 146 may have a multilayer structure. The gate spacer layers 146 may be formed of an oxide, a nitride, or an oxynitride and, in particular, may be formed of a low-k dielectric material. The gate spacer layers 146 may include at least one of, for example, SiO, SiN, SiCN, SiOC, SiON, and SiOCN.

The gate capping layer 148 may be disposed on the gate electrode layer 145, and may have a lower surface and side surfaces, respectively surrounded by the gate electrode layer 145 and the gate spacer layers 146. The gate capping layer 148 may be formed of, for example, an oxide, a nitride, or an oxynitride.

The lower interlayer insulating layer 130 may be disposed to cover the source/drain regions 120 and the gate structures 140. The lower interlayer insulating layer 130 may include at least one of, an oxide, a nitride, and an oxynitride, and may include a low-k dielectric material.

The contact structure CA may penetrate through the lower interlayer insulating layer 130 to be connected to the source/drain regions 120, and may apply an electric signal to the source/drain regions 120. The gate contact structure CB may penetrate through the lower interlayer insulating layer 130 and the gate capping layer 148 to be connected to the gate electrode layer 145, and may apply an electric signal to the gate electrode layer 145. The contact structures CA may be disposed to recess the source/drain regions 120 to a predetermined depth, but example embodiments are not limited thereto. The contact structure CA and the gate contact structure CB may include conductive materials, for example, a metal materials such as tungsten (W), aluminum (Al) or copper (Cu), or semiconductor materials such as doped polysilicon. According to example embodiments, the contact structure CA and the gate contact structure CB may include a barrier metal layer disposed along external surfaces thereof. According to example embodiments, the contact structure CA may further include a metal-semiconductor layer, such as a silicide layer, disposed on an interface in contact with the source/drain regions 120, and the gate contact structure CB may further include a metal-semiconductor layer, such as a silicide layer, disposed on an interface in contact with the gate electrode layer 145.

The upper interlayer insulating layer 150 may cover the contact structure CA and the gate structure CB, and may be disposed on the same level as an interconnection structure including the lower vias V0, the first conductive structure M1, the first vias V1, the second conductive structure M2, the second vias V2, and the third conductive structure M3.

The upper interlayer insulating layer 150 may include first to seventh insulating layers 151, 152, 153, 154, 155, 156, and 157, which may be disposed on the same height levels of the interconnection lines CM, the lower vias V0, the first conductive structure M1, the first vias V1, the second conductive structure M2, the second vias V2, and the third conductive structure M3, respectively. The upper interlayer insulating layer 150 may be formed of a silicon oxide or a low-k dielectric material. The upper interlayer insulating layer 150 may include at least one of, for example, SiO, SiN, SiCN, SiOC, SiON, and SiOCN.

The etch-stop layers 160 may be disposed on lower surfaces of each of the first to seventh insulating layers 151, 152, 153, 154, 155, 156, and 157, respectively. The etch-stop layers 160 may serve as etch-stop layers in etching processes of forming the interconnection lines CM, the lower vias V0, the first conductive structure M1, the first vias V1, the second conductive structure M2, the second vias V2, and the third conductive structure M3, respectively. Each of the etch-stop layers 160 may include a high-k dielectric material and may include, for example, a silicon nitride or an aluminum oxide.

The interconnection lines CM, the lower vias V0, the first conductive structure M1, the first vias V1, the second conductive structure M2, the second vias V2, and the third conductive structure M3, constituting an interconnection structure, may be sequentially stacked. The thicknesses of the first conductive structure M1, the second conductive structure M2, and the third conductive structure M3, which are sequentially stacked, may be increased in an upward direction, but example embodiments are not limited thereto. Each of the interconnection structures may include a conductive material. For example, each of the interconnection structures may include at least one of aluminum (Al), copper (Cu), and tungsten (W).

The barrier layers 170 may be disposed along lower surfaces of the conductive structures M1, M2, and M3 and the vias V0, V1, and V2 in the interconnection structure. Specifically, the barrier layers 170 may be disposed along a lower surface and a side surface of each of the interconnection lines CM, the lower vias V0, the first conductive structure M1, the first vias V1, the second conductive structure M2, the second vias V2, and the third conductive structure M3. Each of the conductive structures M1, M2, and M3 and the vias V0, V1, and V2 may be formed in a single damascene structure. As another example, some of the conductive structures M1, M2, and M3 and the vias V0, V1, and V2 may be formed in a dual damascene structure. In this case, for example, the barrier layers 170 may continuously extend from a side surface and a lower surface of the second conductive structure M2 to lower surfaces of the first vias V1 along side surfaces of the first vias V1. The barrier layers 170 may include at least one of titanium (Ti), tantalum (Ta), cobalt (Co), titanium nitride (TiN), and tantalum nitride (TaN).

Figure 9E:
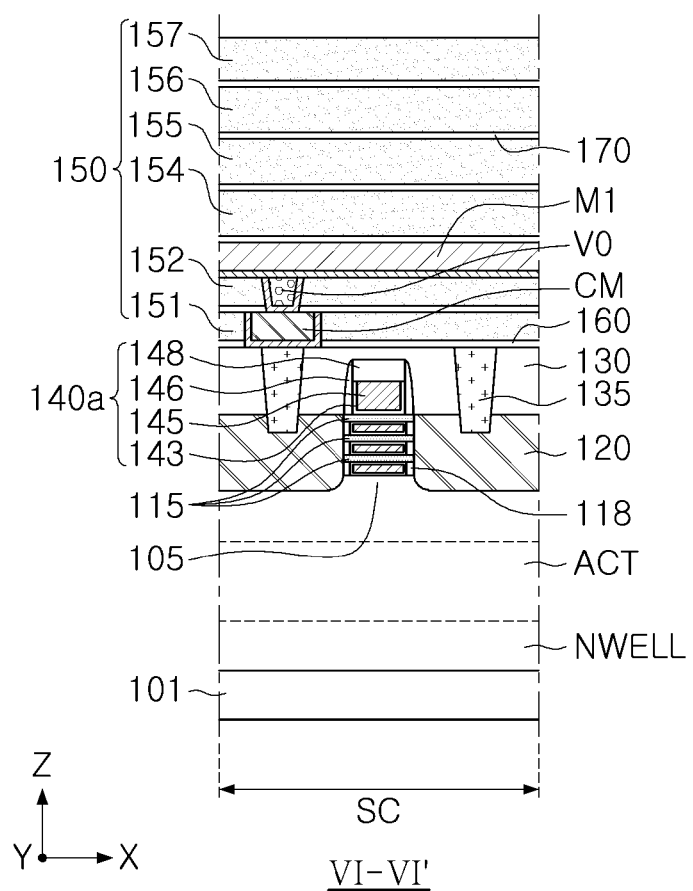

FIG. 9E is a cross-sectional view of a semiconductor device 200a according to example embodiments. FIG. 9E is a modified cross-sectional view taken along line VI-VI' of the semiconductor device 200.

Referring to FIG. 9E, a semiconductor device 200a may include a plurality of channel layers 115, disposed to be vertically spaced apart from each other on the active region ACT, and internal spacer layers 118 disposed in parallel to the gate electrode layer 145 between the plurality of channel layers 115. The semiconductor device 200a may include transistors having a gate-all-around structure in which the gate structure 140a is disposed between the active fin 105 and the channel layers 115 and between a plurality of channel layers 115 having a nanosheet shape. For example, the semiconductor device 200a may include transistors having a multi-bridge channel FET (MBCFET™) structure formed by the channel layers 115, the source/drain regions 120, and the gate structure 140a.

The plurality of channel layers 115 may include two or more channel layers disposed to be spaced apart from each other on the active region ACT in a direction, perpendicular to an upper surface of the active fin 105, for example, in a third direction Z. The channel layers 115 may be connected to the source/drain regions 120 and may be spaced apart from upper surfaces of the active fin 105. Each of the channel layers 115 may have the same (or similar) width as the active fin 105 in a second direction Y, and may have the same (or similar) width as the gate structure 140a in a first direction X. However, according to example embodiments, the channel layers 115 may have a decreased width such that side surfaces of the channel layers 115 are disposed below the gate capping layer 148 in the first direction X.

The plurality of channel layers 115 may be formed of a semiconductor material, and may include, for example, at least one of silicon (Si), silicon germanium (SiGe), and germanium (Ge). The channel layers 115 may be formed of, for example, the same material as the substrate 101. The number and shape of the channel layers 115, constituting a single channel structure, may be changed in various manners according to example embodiments. For example, a channel layer may be further disposed in a region in which the active fin 105 is in contact with the gate electrode layer 145.

The gate structure 140a may be disposed on the active fins 105 and the plurality of channel layers 115. Channel regions of transistors may be formed in the active fins 105 and the plurality of channel layers 115 intersecting the gate structure 140a. The gate insulating layer 142 may be disposed not only between the active fin 105 and the gate electrode layer 145, but also between the plurality of channel layers 115 and the gate electrode layer 145. The gate electrode layer 145 may be disposed on the active fins 105 to extend upwardly of the plurality of channel layers 115 while filling a space between the plurality of channel layers 115. The gate electrode layer 145 may be spaced apart from the plurality of channel layers 115 by the gate insulating layer 142.

The internal spacer layers 118 may be disposed in parallel to the gate electrode layer 145 between the plurality of channel layers 115. The gate electrode layer 145 may be spaced apart from the source/drain regions 120 by the internal spacer layers 118 to be electrically isolated therefrom. Each of the internal spacer layers 118 may have a planar side surface facing the gate electrode layer 145, or may be convexly rounded inwardly of the gate electrode layer 145. The internal spacer layers 118 may be formed of an oxide, a nitride, and an oxynitride and, in particular, may be formed a low-k dielectric material.

In example embodiments, the semiconductor device may include a vertical field effect transistor (FET), in which an active region extending in a direction perpendicular to the upper surface of the substrate 101 and a gate structure surrounding the active region are disposed, in at least one region. Alternatively, the semiconductor device may include a negative capacitance FET (NCFET), using a gate insulating layer having ferroelectric characteristics, in at least one region.

Figure 10:
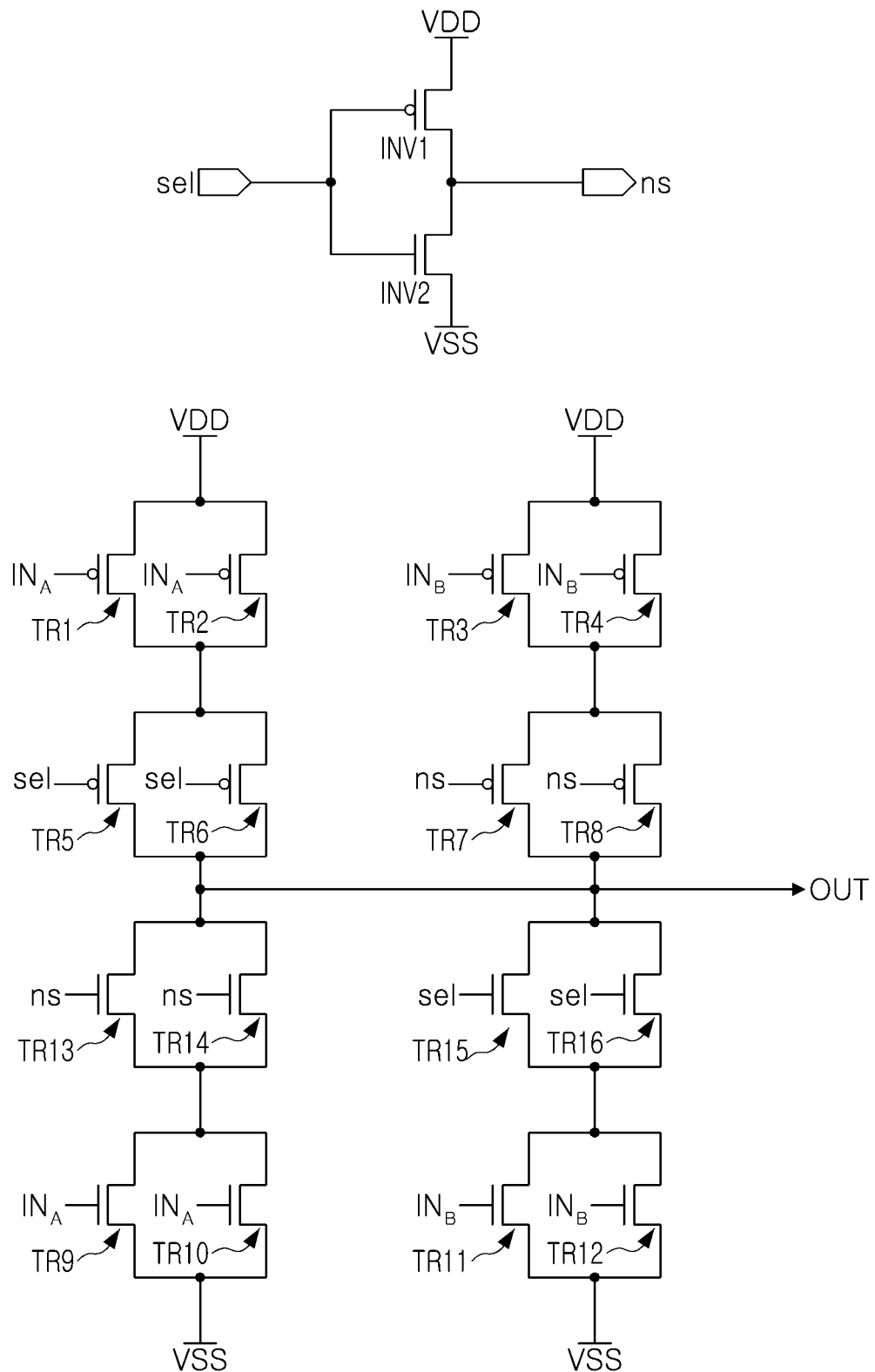
FIG. 10 is a circuit diagram provided by a standard cell included in a semiconductor device according to example embodiments.

FIG. 10 is a circuit diagram provided by a standard cell included in a semiconductor device according to example embodiments. Referring to FIG. 10, a standard cell including a multiplexer (MUX) circuit may be provided.

The multiplexer circuit may include a first transistor TR1 and a second transistor TR2 supplied with first power VDD and connected to each other in parallel, a third transistor TR3 and a fourth transistor TR4 supplied with the first power VDD and connected to each other in parallel, a fifth transistor TR5 and a sixth transistor TR6 connected to the first transistor TR1 and the second transistor TR2 in series and connected to each other in parallel, and a seventh transistor TR7 and an eighth transistor TR8 connected to the third transistor TR3 and the fourth transistor TR4 in series and connected to each other in parallel.

The multiplexer circuit may include a ninth transistor TR9 and a tenth transistor TR10 supplied with second power VSS and connected to each other in parallel, an eleventh transistor TR11 and a twelfth transistor TR12 supplied with the second power VSS and connected to each other in parallel, a thirteenth transistor TR13 and a fourteenth transistor TR14 connected to the ninth transistor TR9 and the tenth transistor TR10 in series and connected to each other in parallel, and a fifteenth transistor TR15 and a sixteenth transistor TR16 connected to the eleventh transistor TR11 and the twelfth transistor TR12 in series and connected to each other in parallel.

The multiplexer circuit may include an inverter circuit. The inverter circuit may include a first transistor INV1, supplied with the first power VDD, and a second transistor INV2 supplied with the second power VSS. The first transistor INV1 and the second transistor INV2 of the inverter circuit may be connected to each other in series.

Gates of the first and second transistors TR1 and TR2 and the ninth and tenth transistors TR9 and TR10 may be connected to each other to provide a first input terminal $IN_A$, and gates of the third and fourth transistors TR3 and TR4 and the eleventh and twelfth transistors TR11 and TR12 may be connected to each other to provide a second input terminal $IN_B$.

Gates of the first and second transistors INV1 and INV2 of the inverter circuit may be connected to each other to provide a select input terminal Sel, and one of source/drain regions of the first transistor INV1 and one of source/drain regions of the second transistor INV2 may be connected to each other to provide an output terminal ns.

The select input terminal Sel of the inverter circuit may be connected to respective gates of the fifth and sixth transistors TR5 and TR6 and the fifteenth and sixteenth transistors TR15 and TR16. The output terminal ns of the inverter circuit may be connected to respective gates of the seventh and eighth transistors TR7 and TR8 and the thirteenth and fourteenth transistors TR13 and TR14.

Some of source/drain regions of the fifth and sixth transistors TR5 and TR6, the seventh and eighth transistors TR7 and TR8, the thirteenth and fourteenth transistors TR13 and TR14, and the fifteenth and sixteenth transistors TR15 and TR16 may be connected to each other to provide an output terminal OUT.

FIGS. 11A to 11I are layout diagrams of a semiconductor device according to example embodiments. For ease of description, components included in a layout diagram of a standard cell of a semiconductor device are sequentially illustrated in FIGS. 11A to 11I. FIGS. 11A to 11H illustrate a standard cell including the multiplexer circuit of FIG. 10.

Figure 11A:
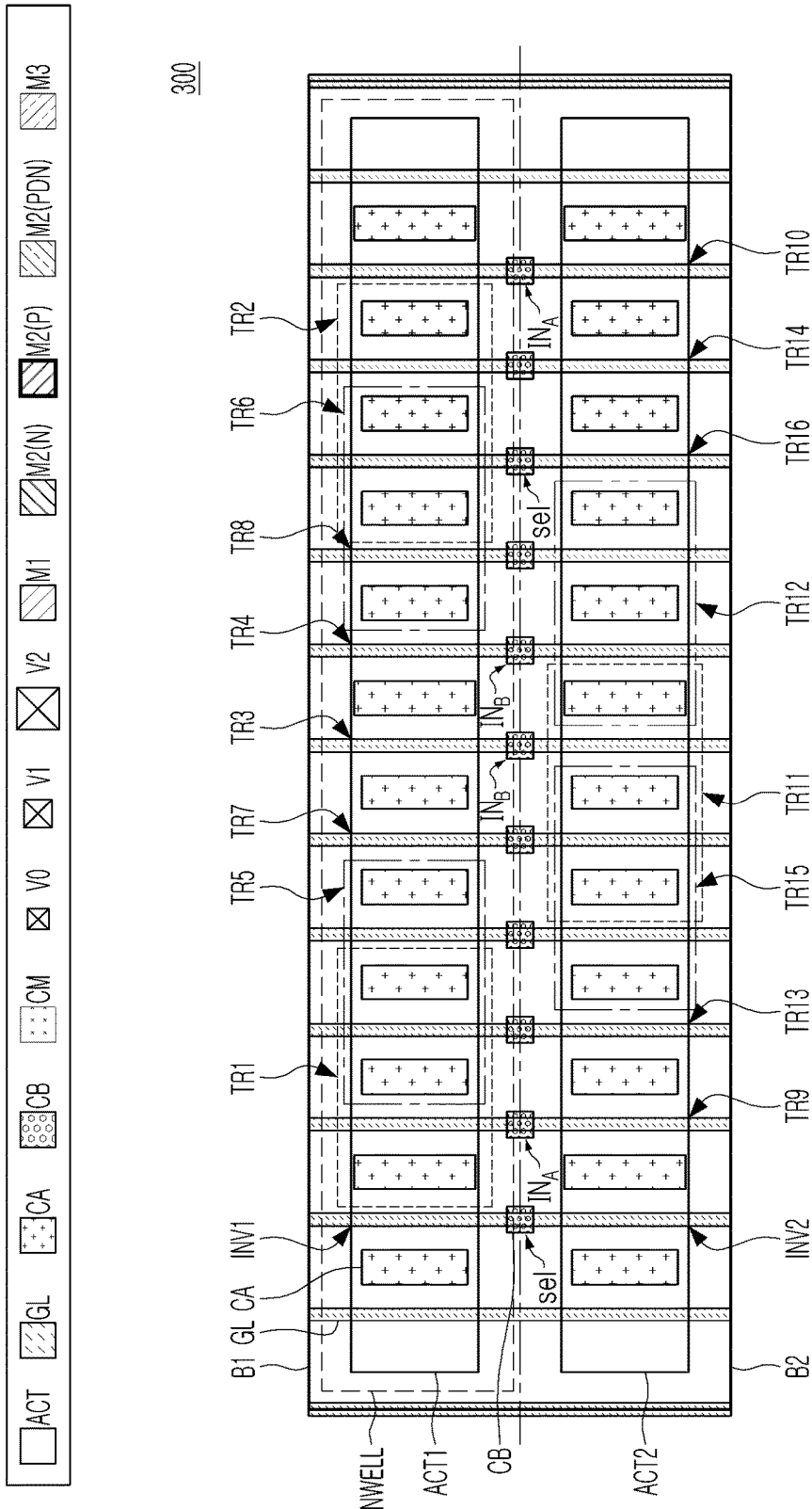
FIGS. 11A, 11B, 11C, 11D, 11E, 11F, 11G, 11H and 11I are layout diagrams of a semiconductor device according to example embodiments.

Referring to FIG. 11A, a standard cell SC of a semiconductor device 300 may include well regions such as N-well regions NWELL, active regions ACT1 and ACT2 extending in a first direction X, gate lines GL extending in a second direction Y, a contact structure CA connected to the active regions ACT1 and ACT2, and a gate contact structure CB connected to the gate lines GL.

A plurality of transistors may be formed in the standard cell SC. For example, FIGS. 11A to 11H illustrate the multiplexer circuit of FIG. 10 in a layout, and first to sixteenth transistors TR1 to TR16 and first and second transistors INV1 and INV2 of an inverter circuit, corresponding to those of FIG. 10, are illustrated in FIG. 11A. A corresponding relationship between a plurality of transistors of the standard cell SC and the transistors of FIG. 10 will be further understood with reference to FIGS. 11B to 11H in which other interconnections and vias below are further illustrated. Gate lines GL may be connected to the first and second input terminals $IN_A$ and $IN_B$ of FIG. 10 through gate contact structures CB to apply a first input signal and a second input signal to gate lines GL, respectively. Gates of the first and second transistors INV1 and INV2 of the inverter circuit may be connected to each other to be connected to a select input terminal Sel, and gates of some transistors TR5, TR6, TR15, and TR16 may be connected to the select input terminal Sel.

Figure 11B:
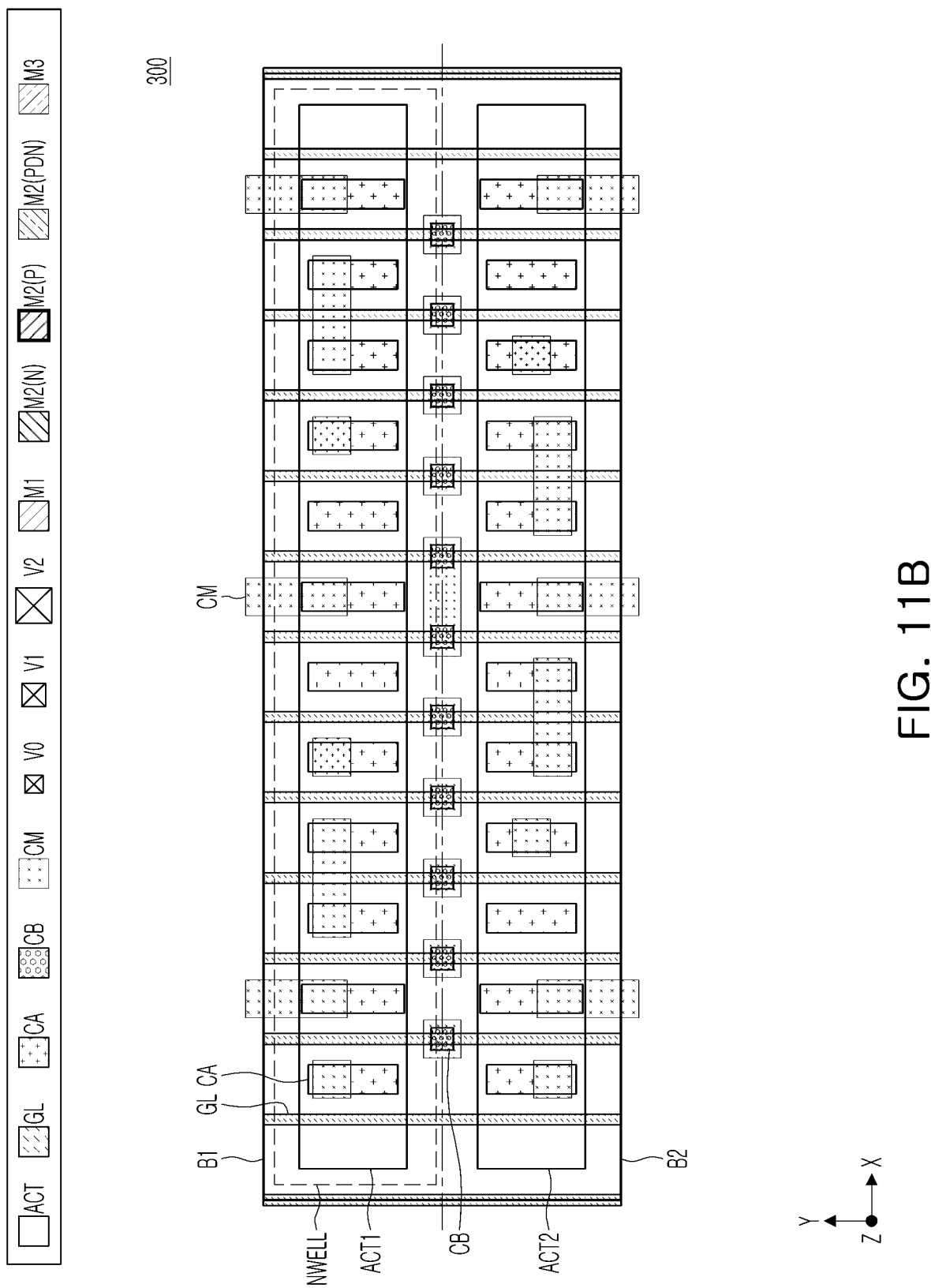

In FIG. 11B, an interconnection line CM is further illustrated in the layout of the standard cell of the semiconductor device 300 of FIG. 11A. The interconnection line CM may be an interconnection connecting contact structures CA on the active regions ACT1 and ACT2 and power supply lines M1(PL1) and M1(PL2) to each other, and may be an interconnection connecting a gate contact structure CB and signal lines M1(S) to each other. Some of the interconnection lines CM may extend in a first direction X to connect adjacent active regions to each other in the first direction X. In this case, the gate line GL overlapping the interconnection lines CM extending in the first direction X, among the interconnection lines CM, may be a dummy gate.

Figure 11C:
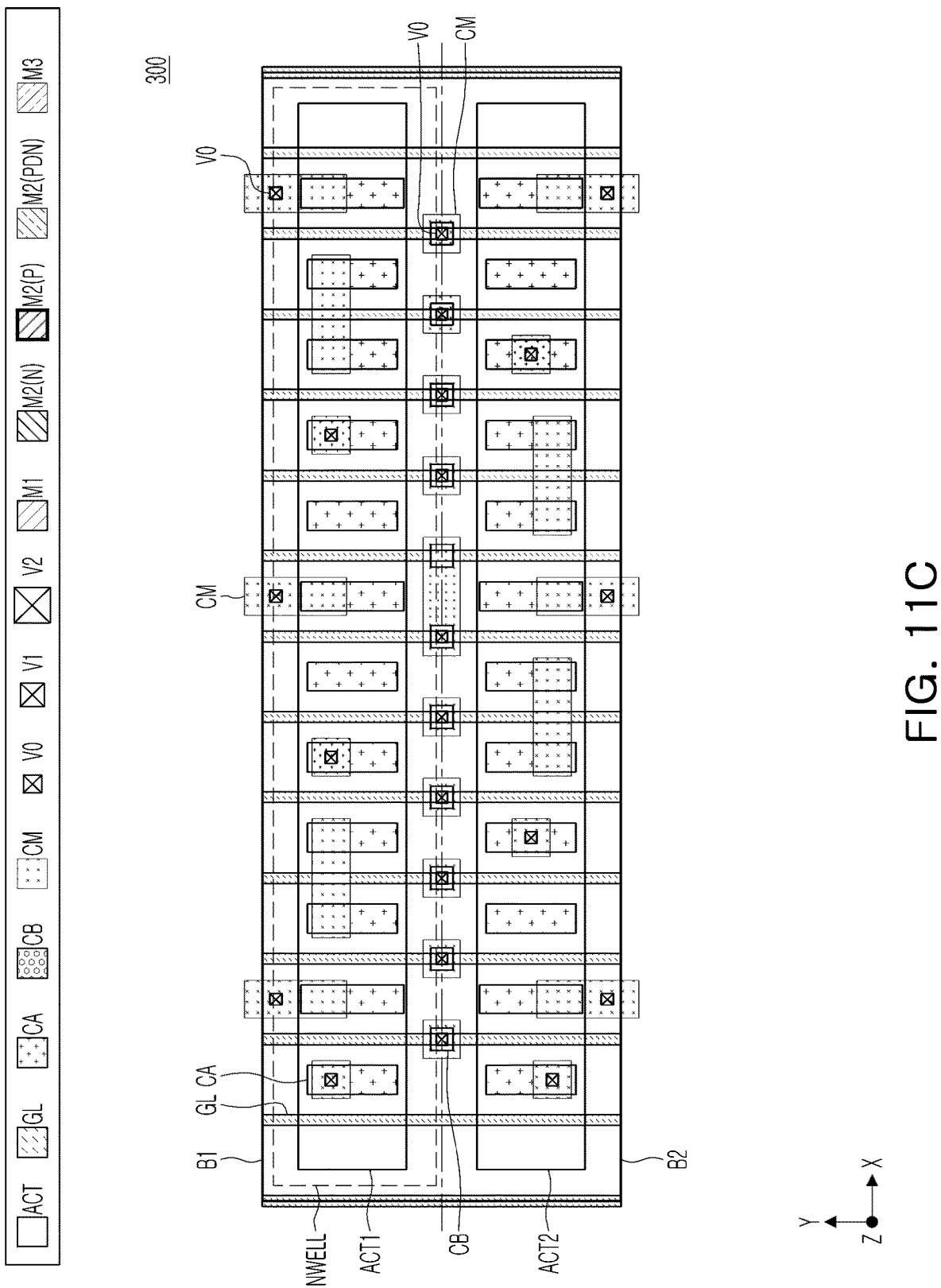

In FIG. 11C, lower vias V0 are further illustrated in the layout of the standard cell of the semiconductor device 300 of FIG. 11B. The lower vias V0 may include lower power vias, first lower connection vias, and second lower connection vias. The lower power vias may connect the interconnection line CM on the contact structure CA and the power supply lines M1(PL1) and M1(PL2) to each other. The first lower connection vias may connect the connection line CM on the gate contact structure CA and the signal lines M1(S) to each other. The second lower connection vias may connect the interconnection line CM on the contact structure CA and the signal lines M1(S) to each other.

Figure 11D:
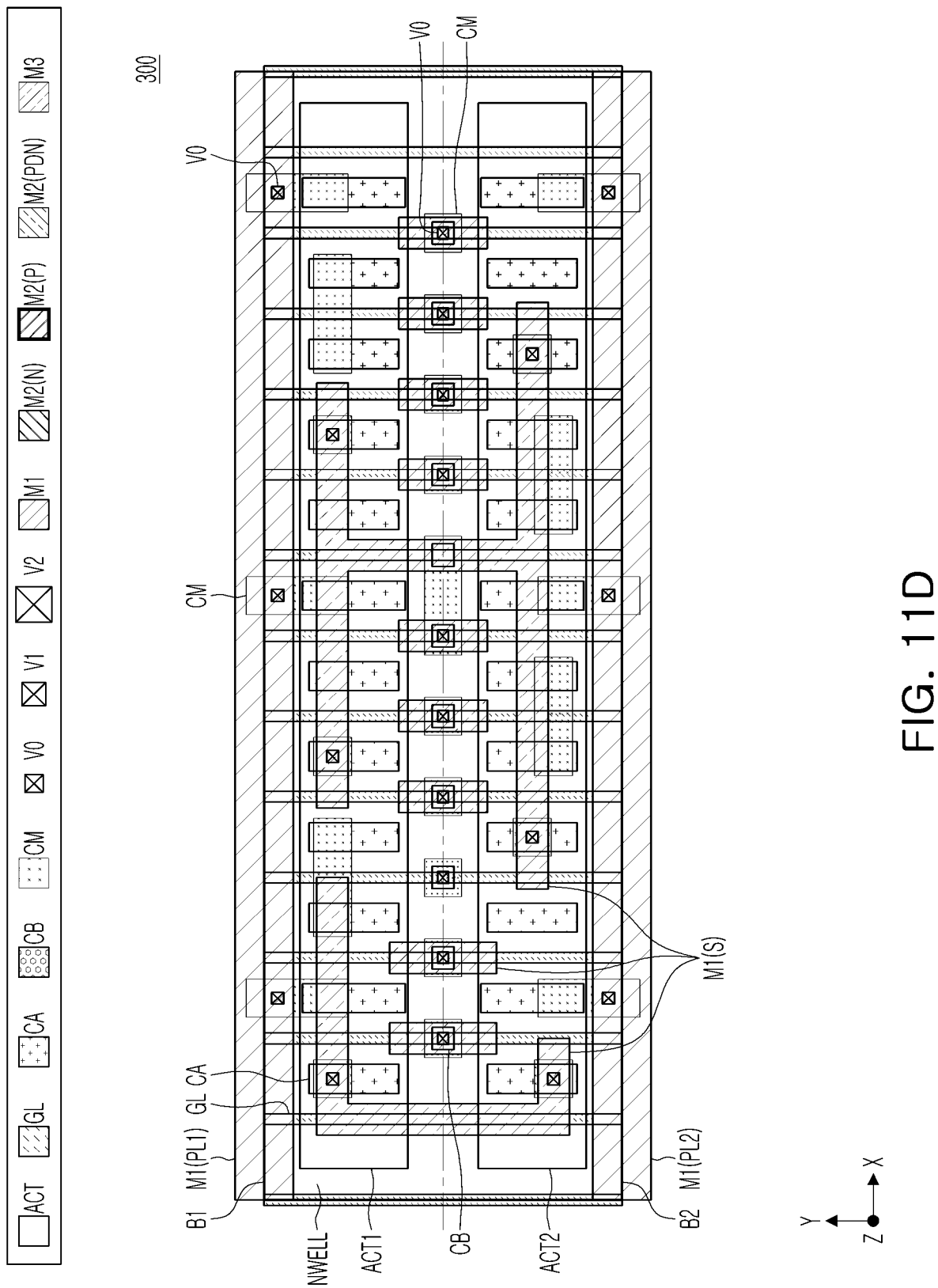

In FIG. 11D, a first conductive structure M1 is further illustrated in the layout of the standard cell of the semiconductor device 300 of FIG. 11B. The first conductive structure M1 may include first and second power supply lines M1(PL1) and M1(PL2) and signal lines M1(S).

The first and second power supply lines M1(PL1) and M1(PL2) may be connected to the lower power vias, among the lower vias V0, to supply power to the active regions ACT1 and ACT2.

Some of the signal lines M1(S) may be connected to the first lower connection vias, among the lower vias V0, to apply input signals (INA, INB, and Sel of FIG. 10) to the gate lines GL.

Some of the signal lines M1(S) may be connected to the second lower connection vias, among the lower vias V0, and may be connected to an output terminal OUT. For example, referring to FIGS. 10, 11A and 11D together, some of the signal lines M1(S) may be connected to drain regions, among source/drain regions on an active region of the fifth to eighth transistors TR5, TR6, TR7, and TR8, and drain region, among source/drain regions on an active region of the thirteenth to sixteenth transistors TR13, TR14, TR15, and TR16, and may be connected to the output terminal OUT through one pin metal line M2(P), among pin metal lines M2(P) disposed thereon.

Figure 11E:
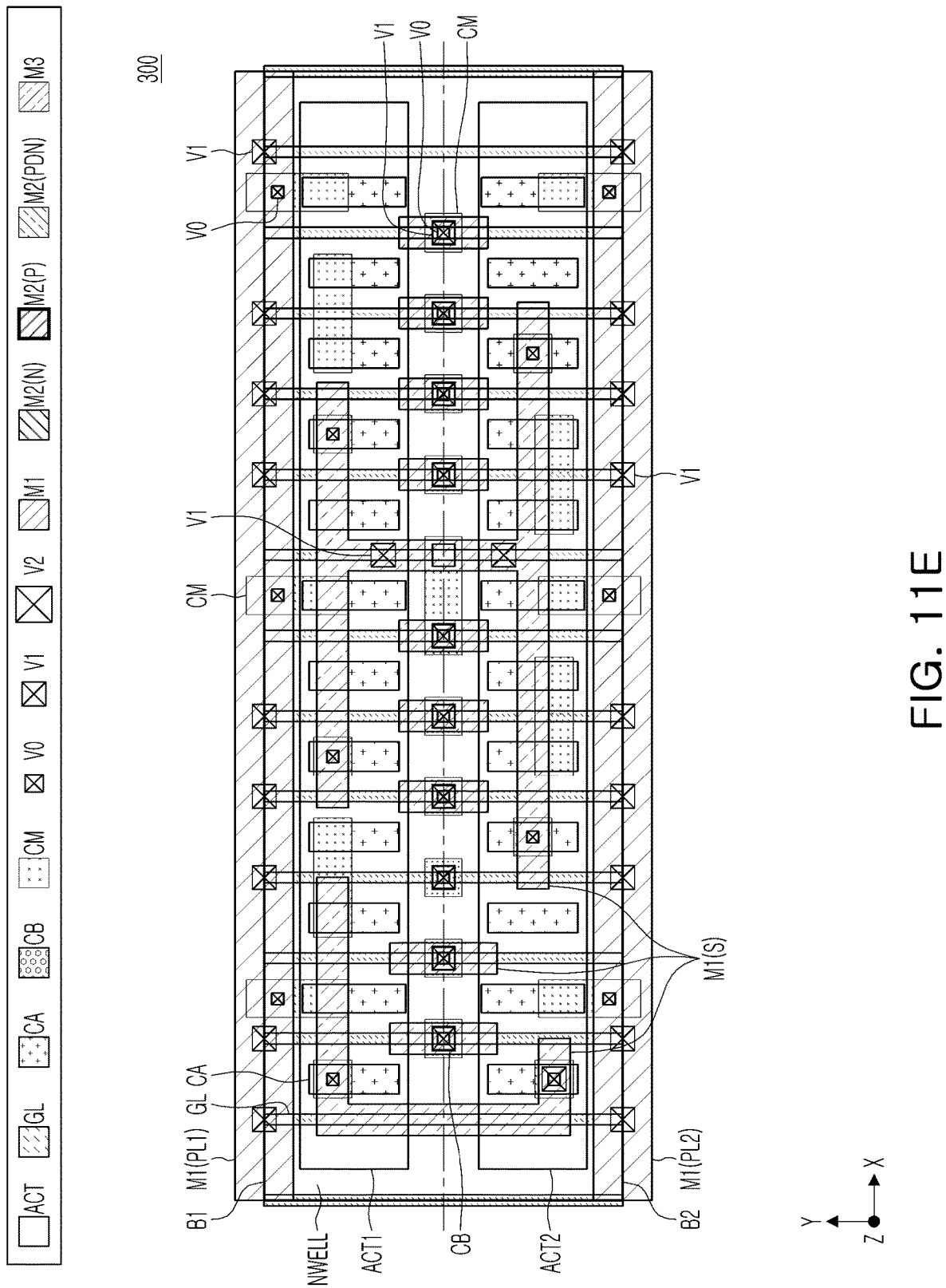

In FIG. 11E, first vias V1 are further illustrated in the layout of the standard cell of the semiconductor device 300 of FIG. 11D. The first vias V1 may include first power vias, connected to the first and second power supply lines M1(PL1) and M1(PL2), and a first connection vias connected to the signal lines M1(S).

Figure 11F:
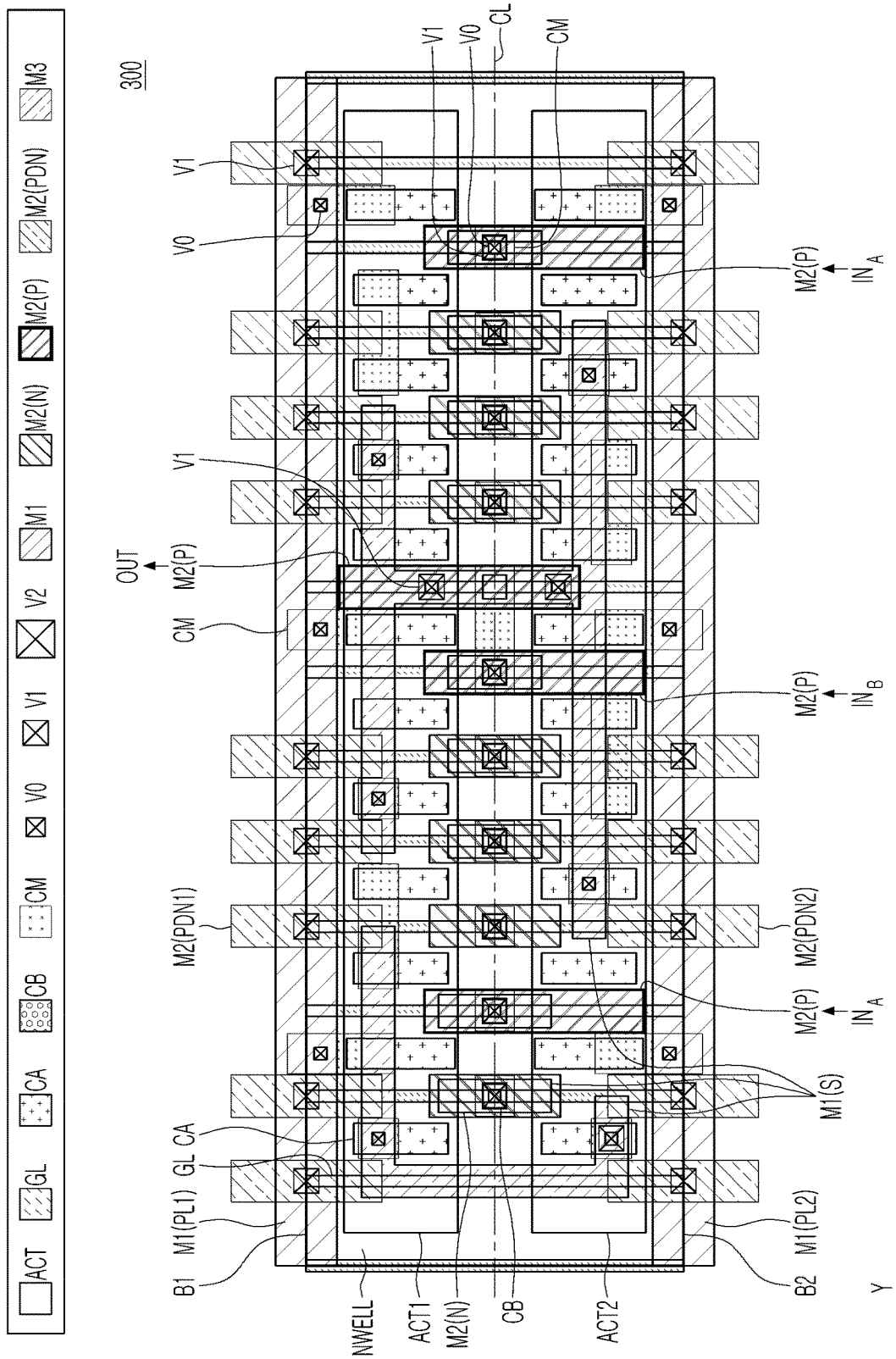

In FIG. 11F, a second conductive structure M2 is further illustrated in the layout of the standard cell of the semiconductor device 300 of FIG. 11E. The second conductive structure M2 may include net metal lines M2(N), pin metal lines M2(P), and first and second power distribution patterns M2(PDN1) and M2(PDN2).

The first and second power distribution patterns M2(PDN1) and M2(PDN2) may be connected to the first power vias, among the first vias V1, to supply power, transferred from upper-level interconnections, to the first and second power supply lines M1(PL1) and M1(PL2).

The net metal lines M2(N) may be connected to the first connection vias, among the first vias V1, to connect some of the gate lines GL to each other. The net metal lines M2(N) may be disposed between the first and second power distribution patterns M2(PDN1) and M2(PDN2). The net metal lines M2(N) may not be disposed between some of the first and second power distribution patterns M2(PDN1) and M2(PDN2).

The pin metal lines M2(P) may be connected to the first connection vias, among the first vias V1, to connect some of the active regions ACT1 and ACT2 to each other. The pin metal lines M2(P) may be included in a routing structure for connection to another standard cell, and may provide the output terminal OUT of FIG. 10. A placement relationship of the second conductive structure M2 will be described again with reference to FIG. 11I.

Figure 11G:
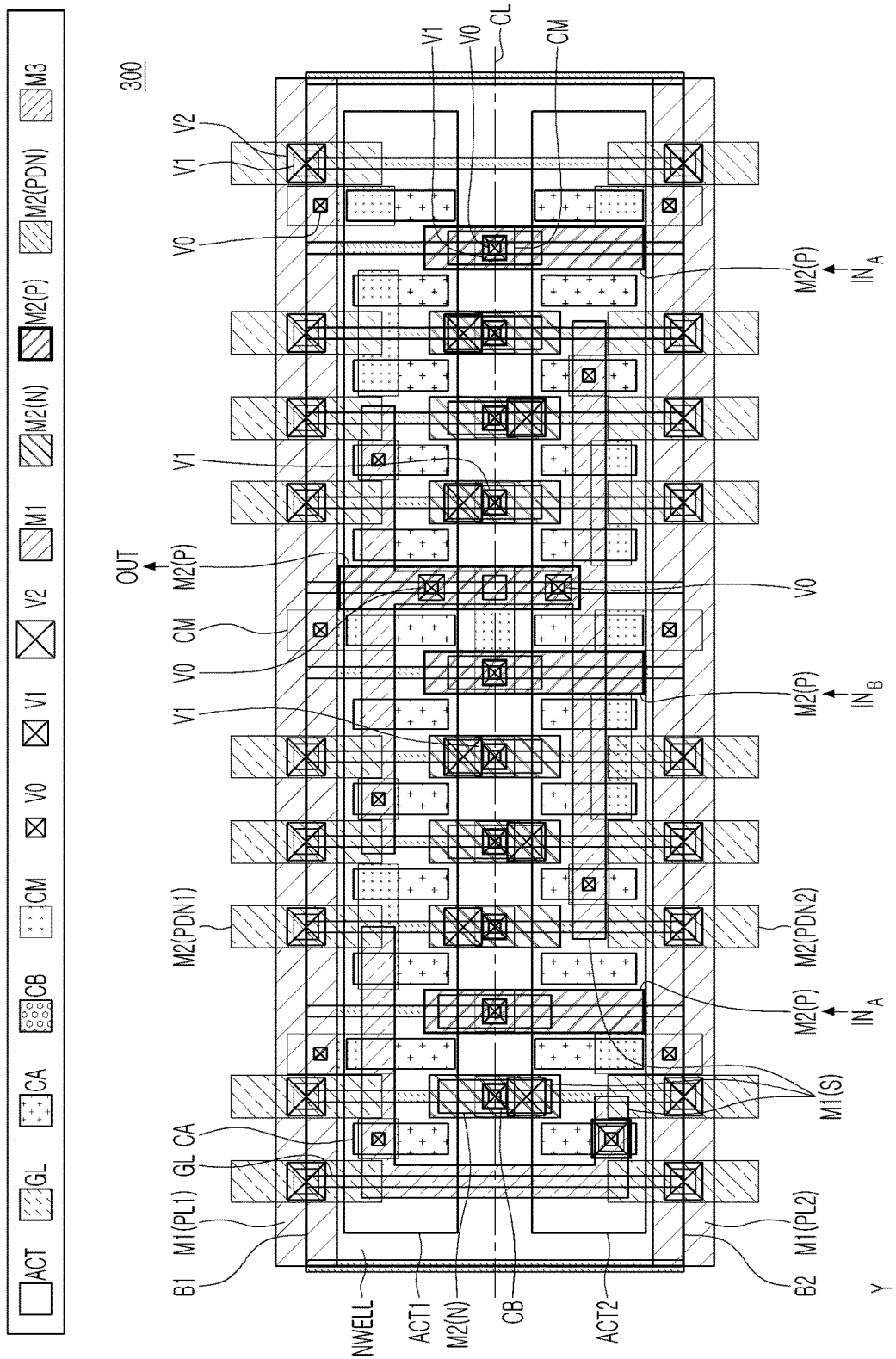

In FIG. 11G, second vias V2 are further illustrated in the layout of the standard cell of the semiconductor device 300 of FIG. 11F. The second vias V2 may include second power vias, connected to the first and second power distribution patterns M2(PDN1) and M2(PDN2), and second connection vias connected to the net metal lines M2(N).

Figure 11H:
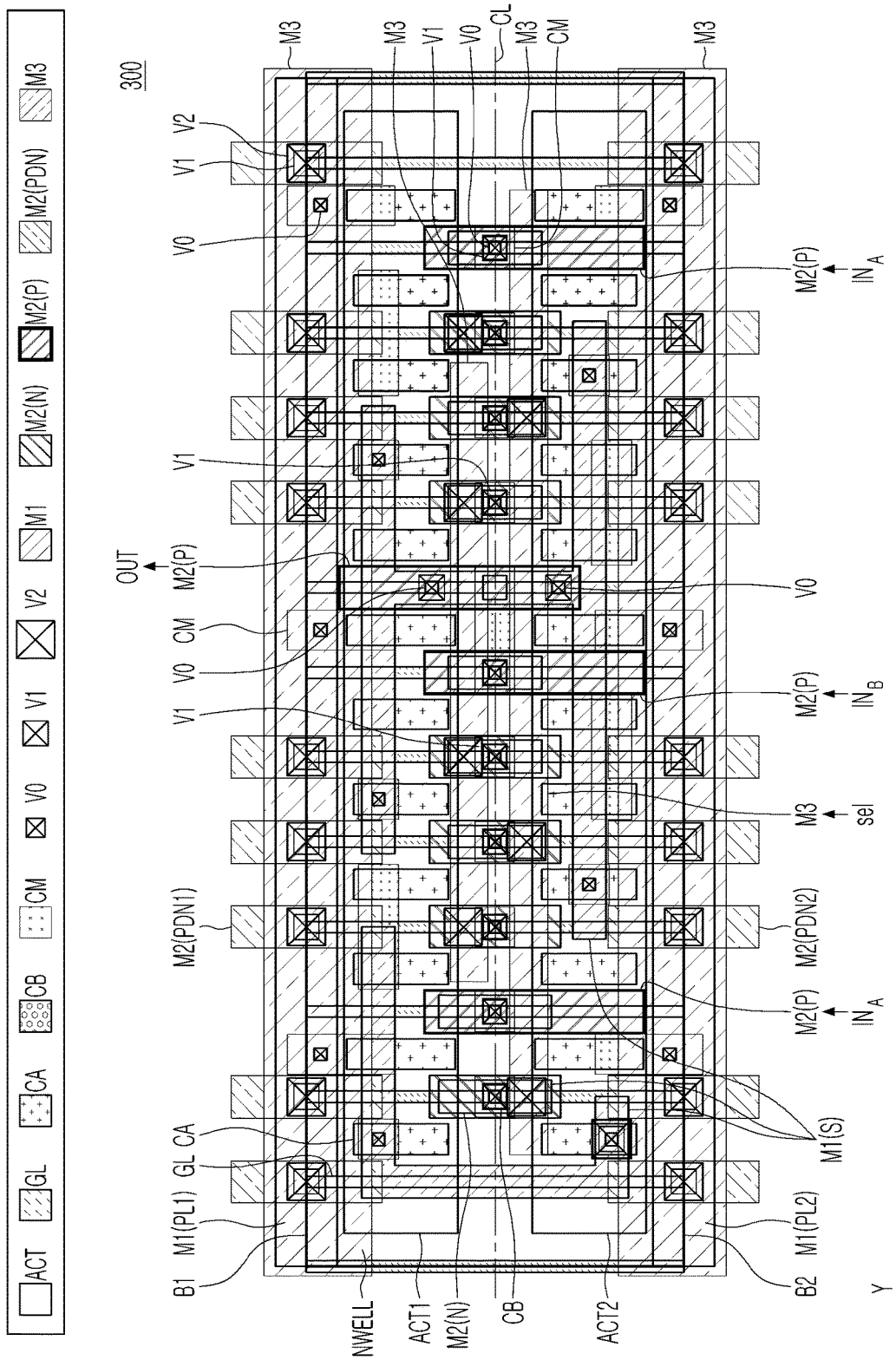

In FIG. 11H, a third conductive structure M3 is further illustrated in the layout of the standard cell of the semiconductor device 300 of FIG. 11G. The third conductive structure M3 may be disposed to overlap the first and second power supply lines M1(PL1) and M1(PL2), and may include metal lines, extending in the first direction X, and metal lines connecting some of the net metal lines M2(N) to each other and extending in the first direction X.

Among the net metal lines M2(N), two net metal lines M2(N) disposed adjacent to the second boundary B2 may be connected to the first input terminal $IN_A$ of FIG. 10 and one net metal line M2(N) disposed adjacent to the second boundary B2 may be connected to the second input terminal $IN_B$ of FIG. 10. For example, the net metal lines M2(N connected to the second input terminal $IN_B$ may be disposed between the two net metal lines M2(N) connected to the first input terminal $IN_A$ of FIG. 10. Among the net metal lines M2(N), a net metal line M2(N) disposed adjacent to the first boundary B1 may be connected to the output terminal OUT of FIG. 10.

Figure 11I:
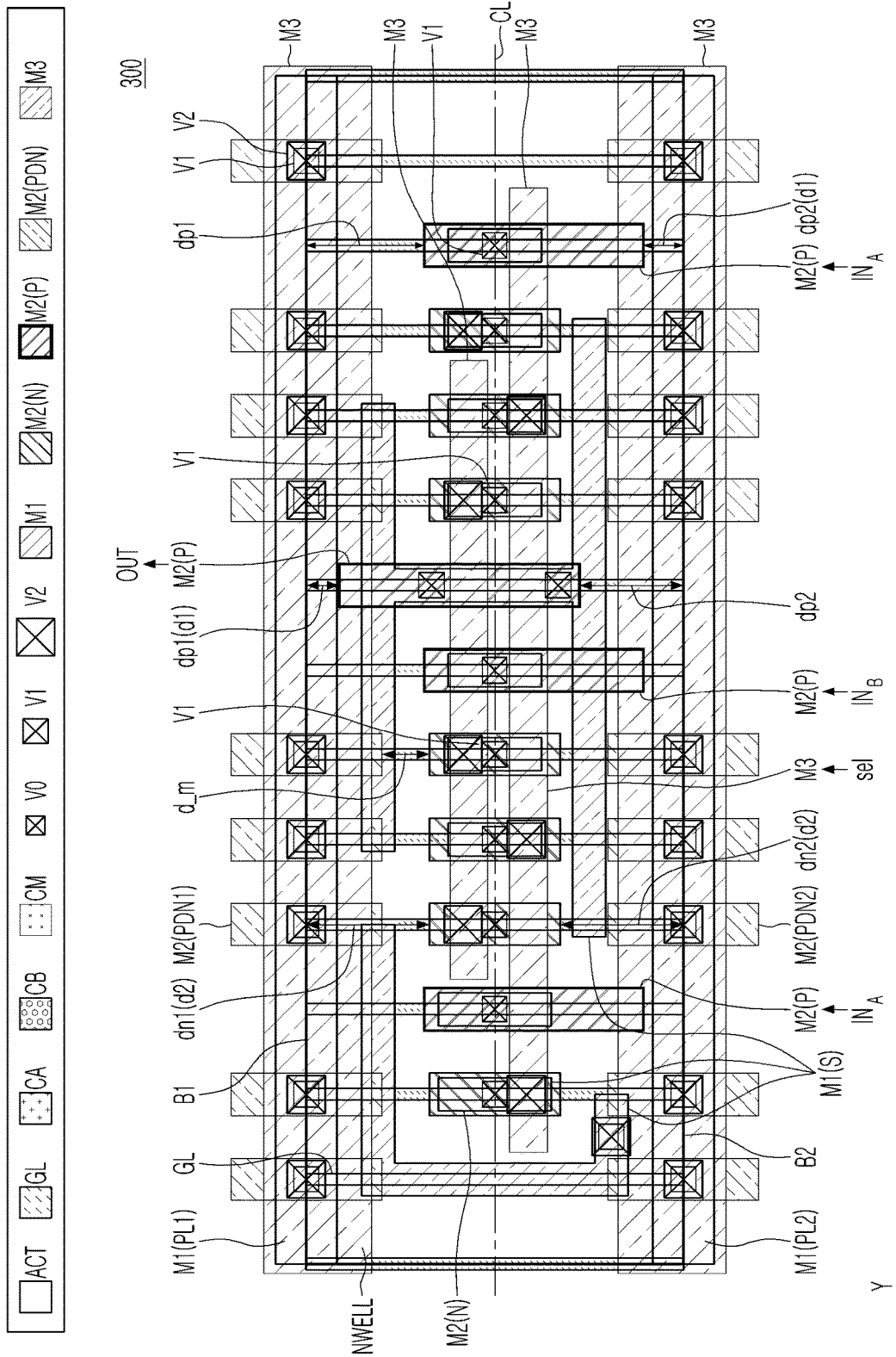

FIG. 11I is a portion of a layout diagram of a semiconductor device according to example embodiments. In FIG. 11I, some components are omitted from the layout diagram of the standard cell of the semiconductor device 200 of FIG. 11I to describe the placement relationship of the second conductive structure M2.

Components of the second conductive structure M2 may be arranged based on the distance design rule described with reference to FIGS. 3 to 4C. For example, the pin metal lines M2(P) may be disposed to be closer to at least one of the first and second boundaries B1 and B2 of the standard cell SC than the net metal lines M2(N). For example, the pin metal lines M2(P) may be disposed based on a distance design rule satisfying $0 \le d1 < d\_c$, and the net metal lines M2(N) may be disposed based on a distance design rule $d2 \ge d\_c$.

A NOR circuit as illustrated in FIGS. 7 to 8H and a multiplexer circuit as illustrated in FIGS. 10 to 11H are only examples of circuits which may be provided by a standard cell, and standard cells may provide various circuits, other than such circuits.

As described above, a semiconductor device, in which placement of metal lines of standard cells is optimized to secure an efficient power distribution network (PDN) solution and to improve routing and placement of the standard cell, may be provided.

Various advantages and effects are not limited to the description above, and may be more readily understood in the description of example embodiments.

While example embodiments have been shown and described, it will be apparent to those skilled in the art that modifications and variations could be made without departing from the scope of the present disclosure as set forth in the appended claims.

What is claimed is:
1. A semiconductor device comprising:
 a standard cell comprising:
  an active region extending in a first direction on a substrate;
  a gate structure intersecting the active region and extending in a second direction intersecting the first direction;
  a first conductive structure comprising:
   a first power supply line and a second power supply line disposed on the active region and the gate structure and extending in the first direction; and
   signal lines disposed between the first power supply line and the second power supply line; and
  a second conductive structure disposed on the first conductive structure, the second conductive structure comprising:
   first power distribution patterns spaced apart from each other in the first direction along a first boundary of the standard cell and electrically connected to the first power supply line;
   second power distribution patterns spaced apart from each other in the first direction along a second boundary of the standard cell and electrically connected to the second power supply line;
   net metal lines disposed between and spaced apart from the first power distribution patterns and the second power distribution patterns, and electrically connected to a first portion of the signal lines; and
   pin metal lines electrically connected to a second portion of the signal lines, and extending in the second direction,
 wherein the first boundary corresponds to the first power supply line and the second boundary corresponds to the second power supply line, wherein each of the net metal lines has a center disposed on a central axis extending in the first direction between the first boundary and the second boundary, wherein, along the second direction, a first distance between the central axis and the first power supply line is substantially equal to a second distance between the central axis and the second power supply line, and wherein at least one of the pin metal lines is disposed closer to the first boundary or the second boundary than the net metal lines.

2. The semiconductor device of claim 1, wherein the pin metal lines are asymmetrically disposed with respect to the central axis of the standard cell in the second direction, and wherein the net metal lines are symmetrically disposed with respect to the central axis of the standard cell in the second direction.

3. The semiconductor device of claim 1, wherein each of the net metal lines is disposed between a single first power distribution pattern of the first power distribution patterns and a single second power distribution pattern of the second power distribution patterns in the second direction.

4. The semiconductor device of claim 3, wherein the first power distribution patterns and the second power distribution patterns do not overlap the first boundary and the second boundary adjacent to the pin metal lines.

5. The semiconductor device of claim 1, wherein a criteria distance d_c corresponds to a sum of a first value corresponding to half of a length of one of the first power distribution patterns in the second direction, and a second value corresponding to a critical spacing distance between end portions of adjacent interconnections, and wherein the pin metal lines are separated from the first boundary and the second boundary in the second direction by at least a first spacing distance d1, and wherein the first spacing distance d1 is greater than or equal to zero and the first spacing distance d1 is less than the criteria distance d_c.

6. The semiconductor device of claim 5, wherein the net metal lines are separated from the first boundary and the second boundary in the second direction by at least a second spacing distance d2, and wherein the second spacing distance d2 is greater than or equal to the criteria distance d_c.

7. The semiconductor device of claim 1, wherein the pin metal lines are interconnection lines of a routing structure between the standard cell and another standard cell that is adjacent to the standard cell.

8. The semiconductor device of claim 7, wherein at least one of the pin metal lines extends past the first boundary or the second boundary.

9. The semiconductor device of claim 7, wherein at least one of the pin metal lines is electrically connected to the other standard cell by upper interconnections.

10. The semiconductor device of claim 1, wherein at least two net metal lines are disposed between a single first power distribution pattern of the first power distribution patterns and a single second power distribution pattern of the second power distribution patterns, and the single first power distribution pattern and the single second power distribution pattern have side surfaces facing each other.

11. The semiconductor device of claim 10, wherein one of the first power distribution patterns has a first width in the first direction and one of the second power distribution patterns has a second width in the first direction, and wherein each of the first width and the second width is smaller than a width of the single first power distribution pattern in the first direction.

12. The semiconductor device of claim 1, wherein the standard cell further comprises:

a contact structure disposed on the active region;

a metal connection structure disposed on the contact structure;

lower power vias disposed on the metal connection structure and electrically connecting the active region to the first power supply line and the second power supply line;

a gate contact structure disposed on the gate structure;

lower connection vias disposed on the gate contact structure and electrically connecting the gate structure to the signal lines;

first power vias disposed on the first power supply line and the second power supply line, and electrically connecting the first power supply line to the first power distribution patterns and the second power supply line to the second power distribution patterns; and first connection vias disposed on the signal lines and electrically connecting the signal lines to the net metal lines.

13. The semiconductor device of claim 1, further comprising:

third metal lines disposed on the net metal lines and extending in the first direction; and second vias disposed between the net metal lines and the third metal lines and electrically connecting the net metal lines to the third metal lines.

\* \* \* \* \*